US010418325B2

(12) United States Patent
Nishida et al.

(10) Patent No.: US 10,418,325 B2
(45) Date of Patent: Sep. 17, 2019

(54) SEMICONDUCTOR DEVICE AND DESIGNING METHOD THEREOF

(71) Applicant: Renesas Electronics Corporation, Tokyo (JP)

(72) Inventors: Hiroki Nishida, Tokyo (JP); Naozumi Morino, Tokyo (JP); Toshimi Mizutani, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 121 days.

(21) Appl. No.: 15/397,762

(22) Filed: Jan. 4, 2017

(65) Prior Publication Data

US 2017/0263550 A1 Sep. 14, 2017

(30) Foreign Application Priority Data

Mar. 10, 2016 (JP) .................................. 2016-047257

(51) Int. Cl.
| | |
|---|---|
| H01L 23/528 | (2006.01) |
| G06F 17/50 | (2006.01) |
| H01L 23/522 | (2006.01) |
| H01L 49/02 | (2006.01) |

(52) U.S. Cl.
CPC ........ *H01L 23/528* (2013.01); *G06F 17/5077* (2013.01); *H01L 23/5226* (2013.01); *H01L 28/00* (2013.01)

(58) Field of Classification Search
None
See application file for complete search history.

(56) References Cited

U.S. PATENT DOCUMENTS

| | | | |
|---|---|---|---|
| 7,032,207 B2 | 4/2006 | Kurose et al. | |
| 2003/0020098 A1* | 1/2003 | Sasaki ............... | H01L 21/76838 257/210 |
| 2010/0102421 A1* | 4/2010 | Chang ................. | H01L 23/5225 257/659 |
| 2015/0155351 A1* | 6/2015 | Kim .................... | H01L 23/5226 257/491 |
| 2015/0302976 A1* | 10/2015 | Chang ................. | H01L 23/5227 336/84 M |

FOREIGN PATENT DOCUMENTS

JP 2004-259967 A 9/2004

* cited by examiner

*Primary Examiner* — Angel Roman
(74) *Attorney, Agent, or Firm* — Mattingly & Malur, PC

(57) ABSTRACT

A metal wiring layer includes a plurality of hierarchical blocks each divided by a side that serves as a boundary. One of the hierarchical blocks is placed to extend along the outer periphery of the self hierarchical block, and includes: a shield ring wire formed by a single metal wire or by a plurality of metal wires; and a plurality of metal wires that are placed inside the shield ring wire and extend in a preferential direction determined in advance. The shield ring wire has a first section extending in the preferential direction and a second section extending in a non-preferential direction perpendicular to the preferential direction.

12 Claims, 21 Drawing Sheets

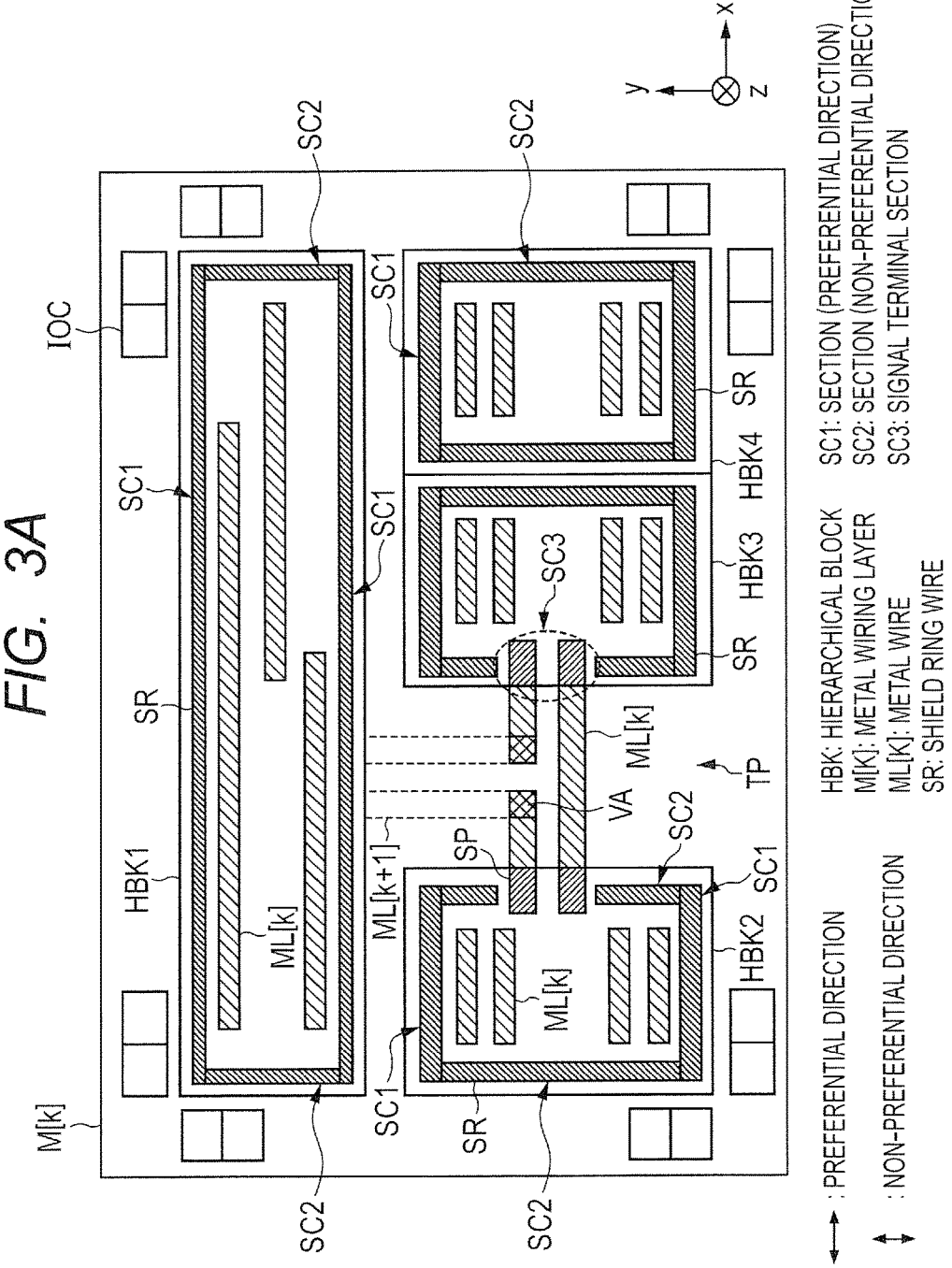

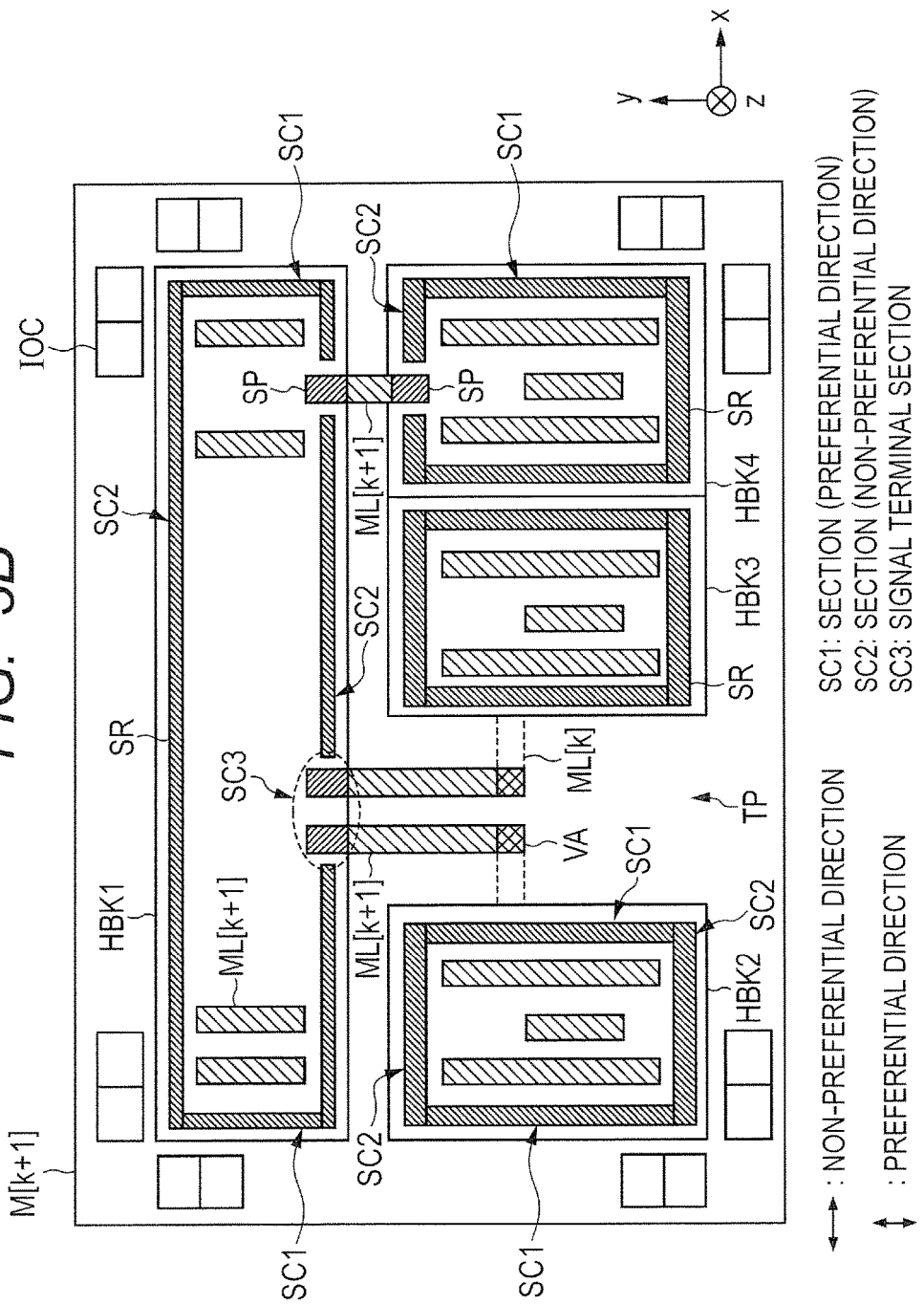

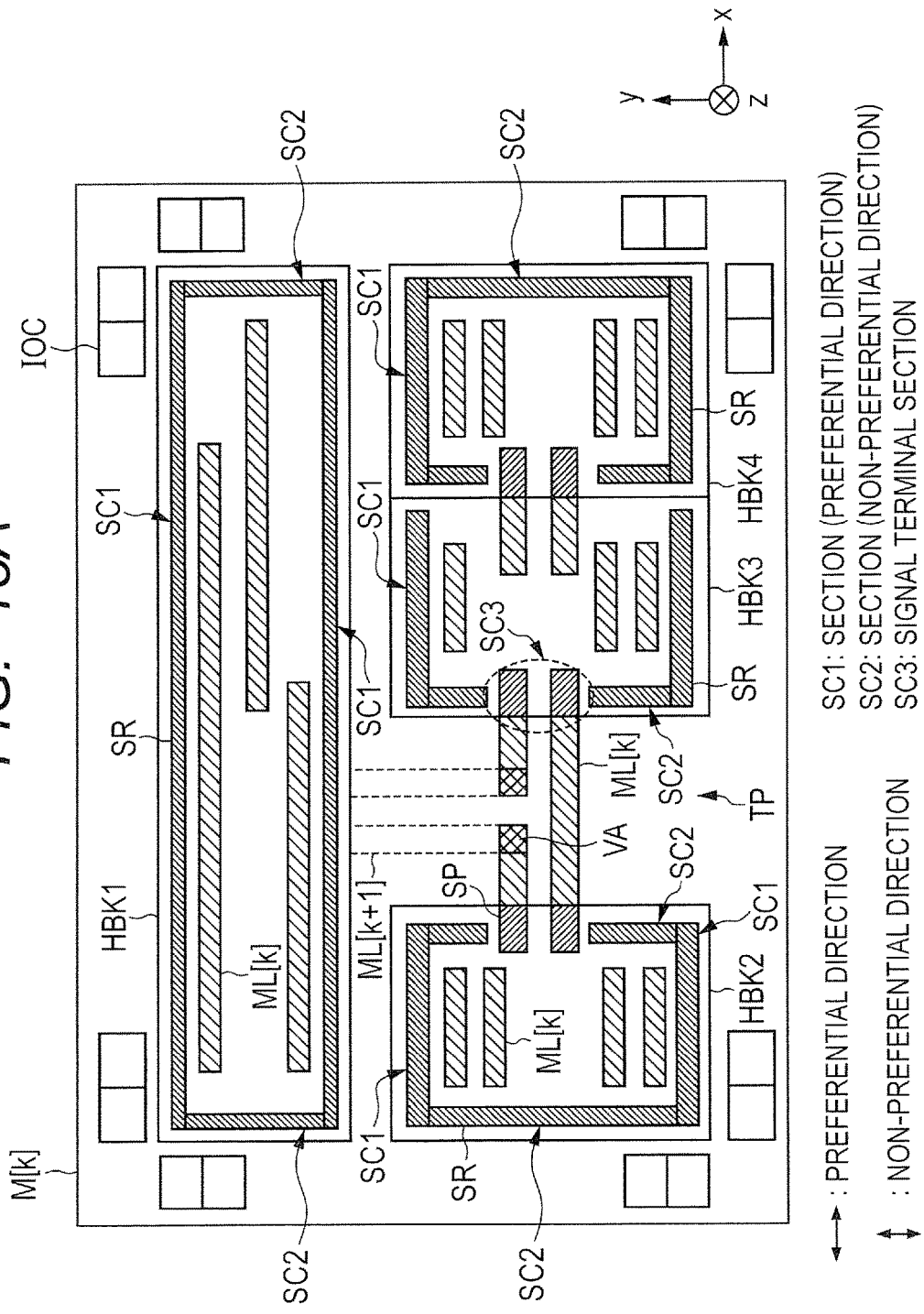

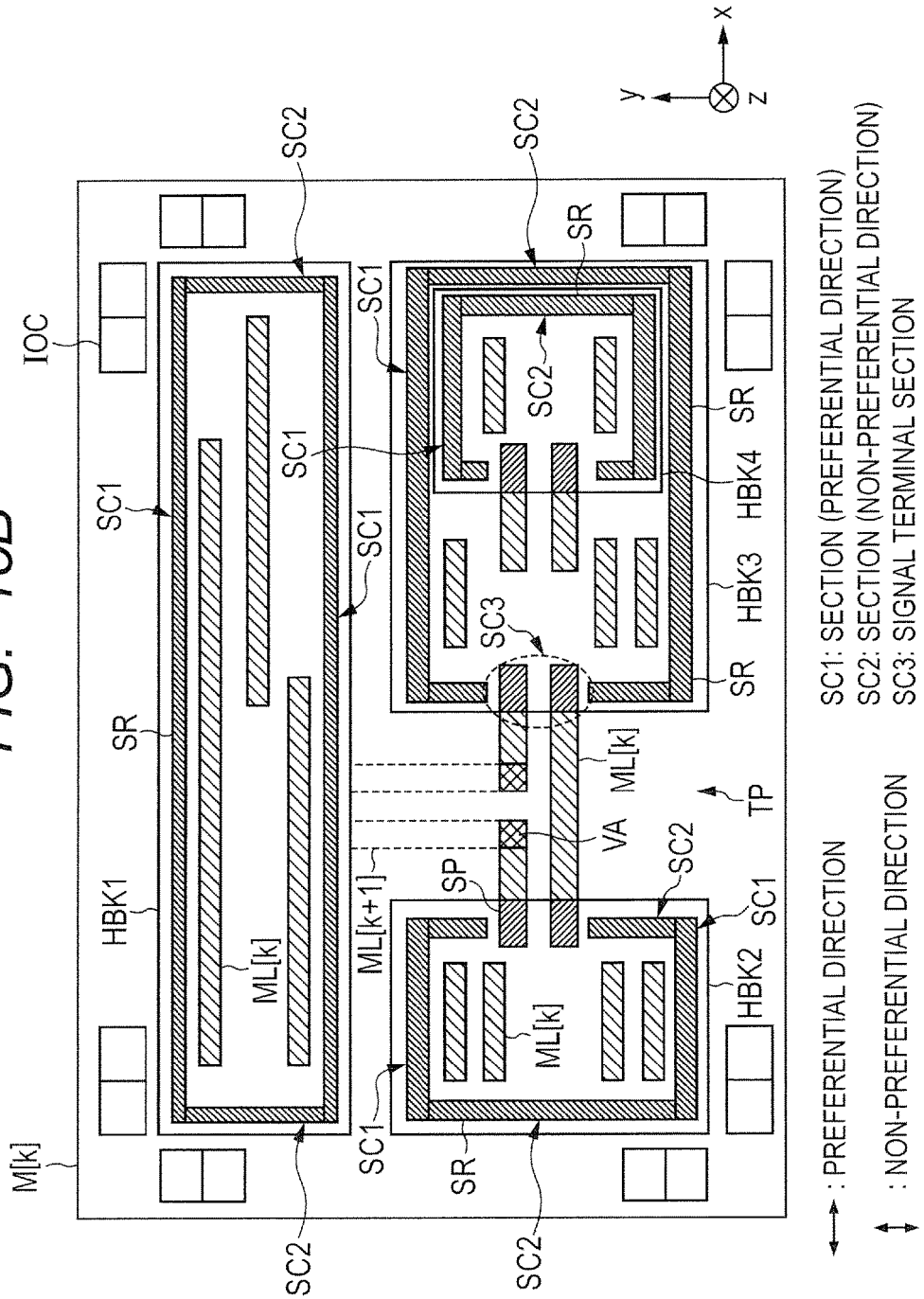

SEMICONDUCTOR DEVICE AND DESIGNING METHOD THEREOF

CROSS-REFERENCE TO RELATED APPLICATIONS

The disclosure of Japanese Patent Application No. 2016-047257 filed on Mar. 10, 2016 including the specification, drawings and abstract is incorporated herein by reference in its entirety.

BACKGROUND

The present invention relates to a semiconductor device and a designing method thereof, and for example, to a semiconductor device designed by a hierarchical layout designing technique and a designing method thereof.

For example, Japanese Unexamined Patent Application Publication No. 2004-259967 describes a method in which when a physical block is designed by a hierarchical layout designing technique, a wiring inhibition region is set in a boundary side having an external coupling terminal and a shield wire is provided in a boundary side not having an external coupling terminal.

SUMMARY

For example, a hierarchical layout designing technique is known as a technique for suppressing an increase in design time associated with the scale-up of semiconductor devices. In the hierarchical layout designing technique, after one semiconductor device is first divided into a plurality of hierarchical blocks and layout designing is performed in parallel for each hierarchical block, these hierarchical blocks are assembled into one semiconductor device. With such a technique, the circuit size of each hierarchical block can be reduced and each hierarchical block can be designed in parallel, and hence the time for designing the layout of the whole semiconductor device can be shortened.

Herein, when the layout of each of the hierarchical block is designed, timing is verified after actual load data, such as wire resistance and wire capacitance, are extracted. In this case, however, the layout of the adjacent hierarchical block is often undetermined, and hence there is the fear that actual load data may not be extracted with a high degree of accuracy in a boundary portion between hierarchical blocks. So, it can be considered that a shield wire and a wiring inhibition region are provided, for example, as in Japanese Unexamined Patent Application Publication No. 2004-259967, but the actual load data may not be extracted with a sufficiently high degree of accuracy when a dummy metal is taken into consideration.

The later-described embodiments have been made in view of these situations, and other problems and new characteristics will become clear from the description and accompanying drawings of the present specification.

A semiconductor device according to one embodiment is formed by a single semiconductor chip, and includes a metal wiring layer. The metal wiring layer includes a plurality of wiring regions each divided by a side that serves as a boundary. One of the wiring regions is placed to extend along the outer periphery of a self wiring region, and includes: a shield ring wire formed by one or more metal wires; and a plurality of metal wires that are placed within a region surrounded by the shield ring wire and extend in a preferential direction determined in advance. Herein, the shield ring wire has a first section extending in the preferential direction and a second section extending in a non-preferential direction perpendicular to the preferential direction.

According to the one embodiment, the actual load data on each hierarchical block can be extracted with a high degree of accuracy in the stage of designing each hierarchical block using a hierarchical layout designing technique.

BRIEF DESCRIPTION OF THE DRAWINGS

FIG. 3A is a plan view illustrating an example of a schematic layout configuration of a metal wiring layer in FIG. 2;

FIG. 3B is a plan view illustrating an example of a schematic layout configuration of the metal wiring layer in FIG. 2;

FIG. 15A is a plan view illustrating an example of a schematic layout configuration of the metal wiring layer in FIG. 2 in a semiconductor device according to Fifth Embodiment of the invention;

FIG. 15B is a plan view illustrating an example of a layout configuration different from that of FIG. 15A;

DETAILED DESCRIPTION

Figure 1:
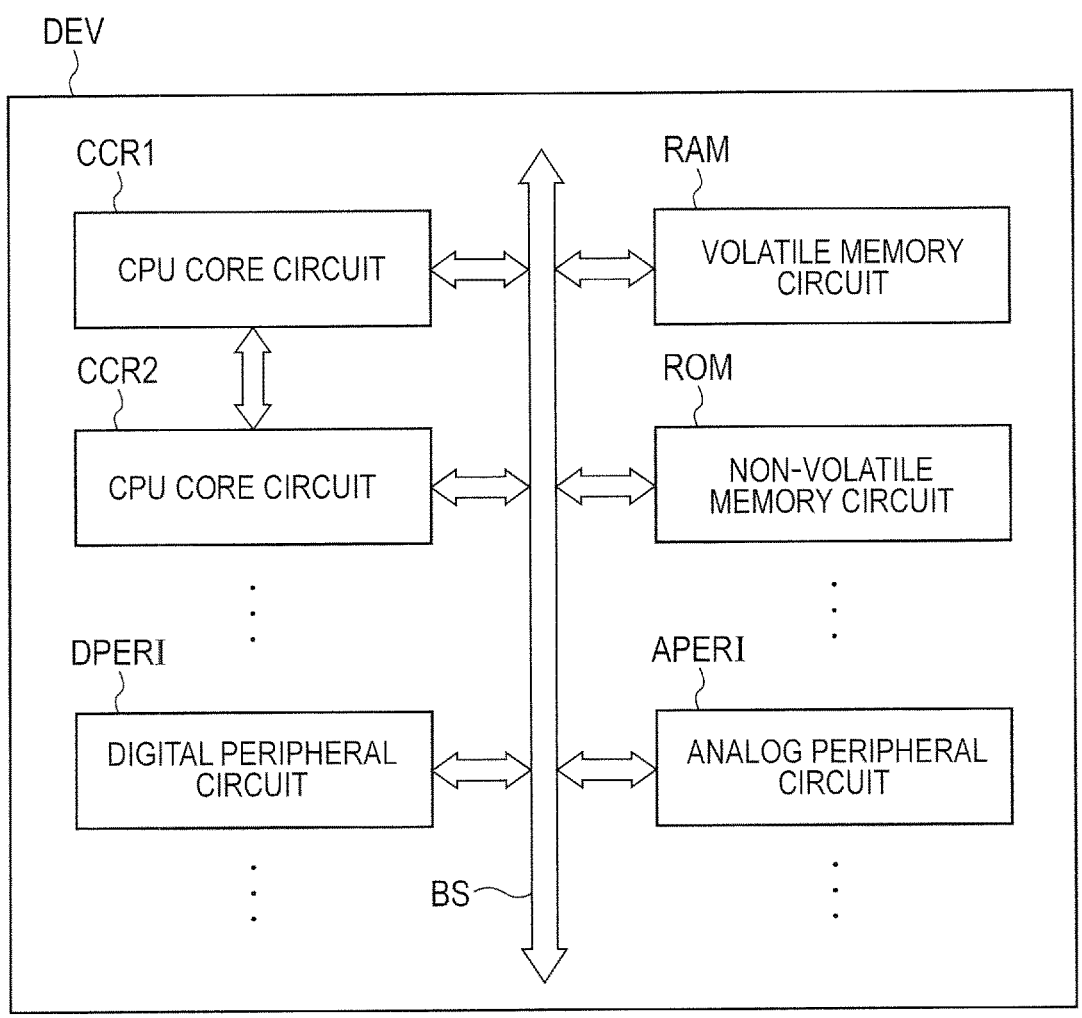
FIG. 1 is a schematic view illustrating an example of a configuration of a semiconductor device according to First Embodiment of the present invention.

If needed for convenience, the following embodiments will be described by dividing each of them into multiple sections or embodiments; however, the multiple sections or embodiments are not irrelevant to each other, but they are in a relationship in which one is a variation, application example, detailed description, or supplementary description of part or the whole of the others, unless otherwise indicated. In addition, in the following embodiments, when referred to the number of elements, etc. (number of units, numerical value, quantity, range, etc., are included), unless stated explicitly or except when the number is obviously limited to specific numbers in principle, the number is not limited to the specific ones but may be more or less than the specific numbers.

Further, in the following embodiments, it is needless to say that components (also including constituent steps, etc.) are not necessarily requisite unless stated explicitly or except when they are obviously requisite in principle. Similarly, when the shapes and positional relations, etc., of the constituents, etc., are referred to in the following embodiments, those substantially the same as or similar to the shapes, etc., should also be included, unless otherwise indicated or except when considered to be clearly otherwise in principle. This also applies to the above numerical values and ranges.

Hereinafter, preferred embodiments of the present invention will be described in detail based on the accompanying drawings. In the whole views for explaining the embodiments, the same members as each other will be denoted with the same reference numeral and duplicative description will be omitted.

(First Embodiment)
<<Schematic Configuration of Semiconductor Device>>

FIG. 1 is a schematic view illustrating an example of a configuration of a semiconductor device according to First Embodiment of the present invention. A semiconductor device DEV illustrated in FIG. 1 is formed by a single semiconductor chip, and includes, for example, a plurality of circuit blocks coupled by a bus BS. Although not particularly limited, the circuit blocks include a plurality of CPU (Central Processing Unit) core circuits CCR1 and CCR2, a volatile memory circuit RAM, a non-volatile memory circuit ROM, various digital peripheral circuits DPERI, various analog peripheral circuits APERI, and the like. In designing the semiconductor device DEV that is multifunctional and has a large circuit size as described above, is designed, it is particularly beneficial to use the later-described hierarchical layout designing technique.

Figure 2:
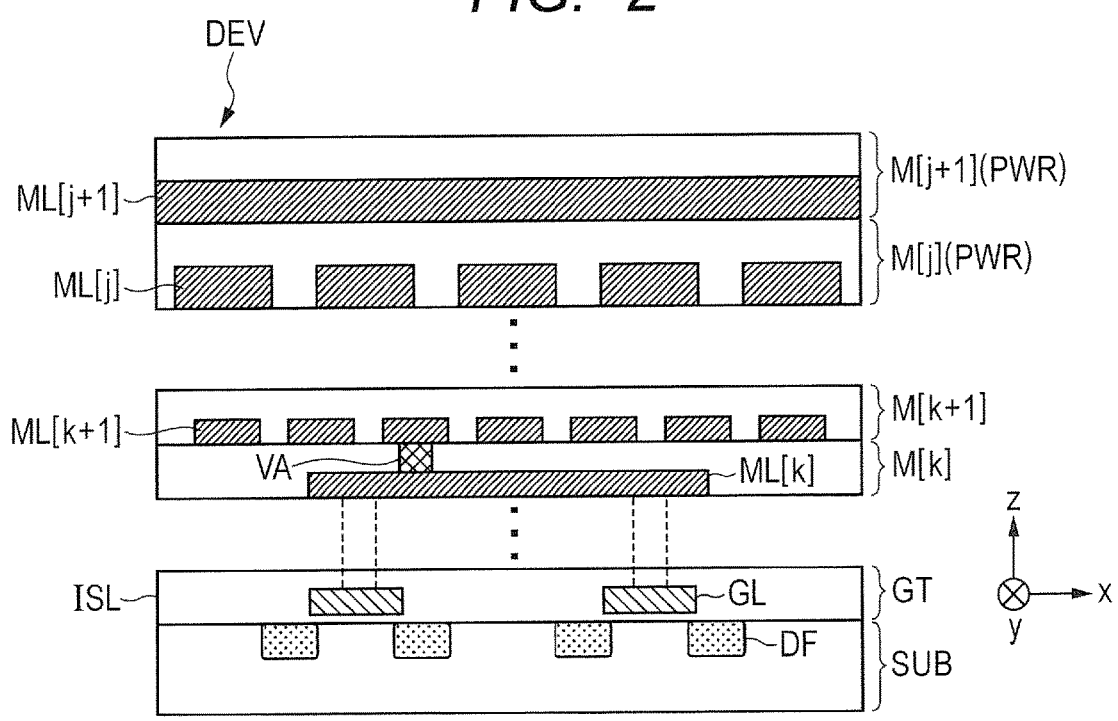
FIG. 2 is a sectional view illustrating an example of a schematic structure of the semiconductor device of FIG. 1.

FIG. 2 is a sectional view illustrating an example of a schematic structure of the semiconductor device of FIG. 1. The semiconductor device DEV illustrated in FIG. 2 has a structure in which a gate layer GT and a plurality of metal wiring layers ( . . . , M[k], M[k+1], . . . , M[j], M[j+1]) are sequentially laminated over a semiconductor substrate SUB. For example, a diffusion layer DF of a MOS (Metal Oxide Semiconductor) transistor, and the like are formed in the semiconductor substrate SUB, and a gate wire GL of the MOS transistor, and the like are formed in the gate layer GT.

Metal wires ( . . . , ML[k], ML[k+1], . . . ) for appropriately coupling respective circuit elements including the MOS transistor, etc., are formed in the metal wiring layers ( . . . , M[k], M[k+1], . . . ). The metal wires ( . . . , ML[k], ML[k+1], . . . ) in the respective metal wiring layers are isolated by interlayer insulating films ISL. In actually coupling the respective circuit elements, placing of metal wires ( . . . , ML[k], ML[k+1], . . . ) is appropriately performed through a via VA between the upper and lower metal wiring layers ( . . . , M[k], M[k+1], . . . ). Additionally, metal wires ( . . . , ML[j], ML[j+1]) for supplying power supply voltages PWR (specifically, a power supply voltage (VCC) on a high potential side and a power supply voltage (GND) on a low potential side) to the whole chips are mainly formed in the uppermost metal wiring layers ( . . . , M[j], M[j+1]).

<<Layout of Metal Wiring Layer>>

Each of FIGS. 3A and 3B is a plan view illustrating an example of a schematic layout configuration of the metal wiring layer in FIG. 2. FIG. 3A illustrates an example of a layout configuration of the metal wiring layer M[k] in FIG. 2, and FIG. 3B illustrates an example of a layout configuration of the metal wiring layer M[k+1] located one layer above.

Each of the metal wiring layers M[k] and M[k+1] respectively illustrated in FIGS. 3A and 3B includes a plurality of hierarchical blocks (wiring regions) HBK1 to HBK4 each divided by a side that serves as a boundary. In each of FIGS. 3A and 3B, the wiring region except the hierarchical blocks HBK1 to HBK4 serves as a top region TP. In the present specification, the wiring region except the hierarchical blocks HBK1 to HBK4 is referred to as the top region TP for convenience of description; however, assuming that the hierarchical blocks HBK1 to HBK4 are a lower hierarchical block, the top region TP is strictly positioned as an upper block including the lower hierarchical block.

In this example, a plurality of IO (input output) cells IOC, which are placed along the outer periphery of the semiconductor chip and are responsible for input/output with the outside of the semiconductor chip, are included in the top region TP. Additionally, although not particularly limited, each of the hierarchical blocks HBK1 to HBK4 is placed adjacent to (in other words, is placed to have a boundary side with) the top region TP, and further the hierarchical blocks HBK3 and HBK4 are placed adjacent to each other.

Depending, for example, on the ease of layout, etc., each of the hierarchical blocks HBK1 to HBK4 may correspond to anyone of the circuit blocks in FIG. 1, or to a combination of the circuit blocks, or to one obtained by dividing one of the circuit blocks. Although not necessarily limited, the top region TP is often and mainly responsible for the coupling between the hierarchical blocks HBK1 to HBK4 or between the hierarchical blocks HBK1 to HBK4 and the IO cells IOC.

In forming a metal wire in a metal wiring layer, a preferential direction, along which the metal wire will extend, is generally determined based on a design tool, such as automatic layout wiring. A direction perpendicular to the preferential direction becomes a non-preferential direction. The preferential direction and the non-preferential direction of this wire are alternately replaced with each other for every metal wiring layer. For example, the preferential direction of the metal wiring layer M[k] in FIG. 3A is an x axis direction, and the non-preferential direction thereof is a y axis direction. Conversely, the preferential direction of the metal wiring layer M[k+1] in FIG. 3B, which is located one layer above (the same is true with the layer one layer below), is the y axis direction, and the non-preferential direction thereof is the x axis direction.

In the metal wiring layer M[k] in FIG. 3A, each of the hierarchical blocks (wiring regions) HBK1 to HBK4 includes a shield ring wire SR and a plurality of metal wires ML[k]. The shield ring wire SR is placed to extend along the outer periphery of a corresponding hierarchical block, and although not necessarily limited, it is placed at a position located, based on a boundary side that is the outer periphery, inside by a minimum space determined by a layout rule. Although not particularly limited, the width of the shield ring wire SR is herein a minimum line width determined by the layout rule.

The shield ring wire SR is formed by a single metal wire in this example, but it may be formed by a combination of a plurality of metal wires (this will be described in detail later). Herein, the shield ring wire SR is characterized by having a section SC1 extending in the preferential direction and a section SC2 extending in the non-preferential direction.

The metal wires ML[k] are placed in a region surrounded by the shield ring wire SR, and extend in the preferential direction (herein, x axis direction). Herein, the metal wires ML[k] extending in the preferential direction are only schematically illustrated, but the metal wires extending in the non-preferential direction (herein, y axis direction) can actually exist. However, in view, for example, of the area occupied by the whole wires, the area occupied by the metal wires extending in the preferential direction is sufficiently larger than that occupied by the metal wires extending in the non-preferential direction.

Additionally, one or more of the hierarchical blocks HBK1 to HBK4 may have a signal terminal SP to be coupled to another wiring region (i.e., top region TP or another hierarchical block) in the metal wiring layer M[k]. In the example of FIG. 3A, each of the hierarchical blocks HBK2 and HBK3 has the signal terminal SP. The signal terminal SP is placed in a signal terminal section SC3 that is a partial section of any one of the sides extending in the non-preferential direction (herein, y axis direction). The shield ring wire SR in the section SC2 extending in the non-preferential direction is placed in a section of the any one side except the signal terminal section SC3.

The metal wiring layer M[k+1] in FIG. 3B also has a configuration similar to that of the metal wiring layer M[k] in FIG. 3A. In FIG. 3B, however, a plurality of metal wires ML[k+1] placed in a region surrounded by the shield ring wire SR in each of the hierarchical blocks HBK1 to HBK4 extend in a preferential direction different from that in FIG. 3A (herein, y axis direction). In FIG. 3B, each of the hierarchical blocks HBK1 and HBK4 includes the signal terminal SP, unlike the case of FIG. 3A. The signal terminal SP is placed in a signal terminal section SC3 of a side extending in a non-preferential direction (herein, x axis direction), like the case of FIG. 3A.

In the example of each of the metal wiring layers M[k] and M[k+1] in FIGS. 3A and 3B, metal wires for coupling the signal terminals SP of each of the hierarchical blocks HBK1 to HBK4 are formed in the top region TP. Each of the metal wires also extends in the preferential direction. For example, in the metal wiring layer M[k], the metal wire ML[k] for coupling the signal terminals SP of the respective hierarchical blocks HBK2 and HBK3 to each other, and partial metal wires ML[k] for coupling the signal terminal SP of each of the hierarchical blocks HBK2 and HBK3 to the signal terminal SP of the hierarchical block HBK1, are formed.

In the metal wiring layer M[k+1], the metal wire ML[k+1] for coupling the signal terminals SP of the respective hierarchical blocks HBK1 and HBK4 to each other, and another partial metal wires ML[k+1] for coupling the signal terminal SP of each of the hierarchical blocks HBK2 and HBK3 to the signal terminal SP of the hierarchical block HBK1, are formed. The another partial metal wires ML[k+1] and the aforementioned partial metal wires ML[k], respectively extending from the signal terminals SP and in the preferential directions, are coupled together through the vias VA.

Figure 4:
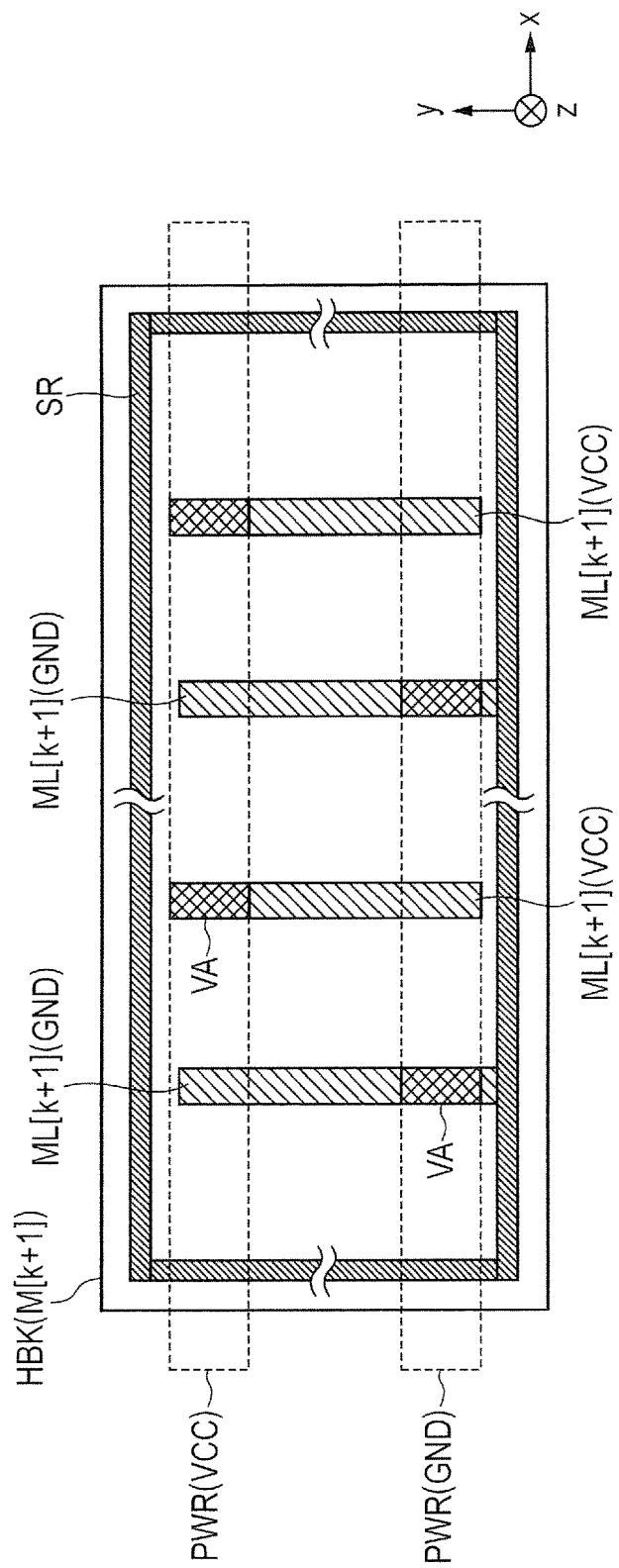
FIG. 4 is an illustrative view illustrating an example of a power supply system for a shield ring wire in FIGS. 3A and 3B.

FIG. 4 is an illustrative view illustrating an example of a power supply system in which power is supplied to the shield ring wire in each of FIGS. 3A and 3B. FIG. 4 illustrates an example of a layout configuration including a power supply path, in which one of the hierarchical blocks HBK in the metal wiring layer M[k+1] illustrated in FIG. 3B is taken as an example. The shield ring wire SR is provided in the outer periphery of the hierarchical block HBK, as described above. For example, a plurality of metal wires ML[k+1] (GND) for supplying a power supply voltage GND on a low potential side to each circuit and a plurality of metal wires ML[k+1] (VCC) for supplying a power supply voltage VCC on a high potential side thereto are provided inside the hierarchical block HBK.

Both the metal wires ML[k+1] (GND) and the metal wires ML[k+1] (VCC) extend in the preferential direction (herein, y axis direction), and are alternately placed at predetermined intervals in the non-preferential direction (x axis direction). Each of the metal wires ML[k+1] (GND) is directly coupled, through the via VA, to a metal wire for the power supply voltage PWR (power supply voltage GND on a low potential side) formed in the uppermost metal wiring layer (..., M[j], M[j+1]) illustrated in FIG. 2. Similarly, each of the metal wires ML[k+1] (VCC) is directly coupled, through the via VA, to a metal wire for the power supply voltage PWR (power supply voltage VCC on a high potential side) formed in the uppermost metal wiring layer ( . . . , M[j], M[j+1]).

In the example of FIG. 4, each of the metal wires ML[k+1] (GND) is coupled to the shield ring wire SR. As a result, the power supply voltage GND on a low potential side is indirectly applied to the shield ring wire SR via the metal wire ML[k+1] (GND). Herein. another configuration may be adopted, in which the power supply voltage VCC on a high potential side is applied to the shield ring wire SR without being limited to the power supply voltage GND on a low potential side. Although detailed description will be made later, the shield ring wire SR is not a wire whose main purpose is to supply power, and hence yet another configuration may be adopted in which the shield ring wire SR is indirectly coupled to the uppermost metal wiring layer. Thereby, an increase in the number of the vias VA, etc., can be suppressed in comparison with the configuration in which it is directly coupled.

<<Configuration and Designing Method of Semiconductor Device (Comparative Example)>>

Figure 17A:
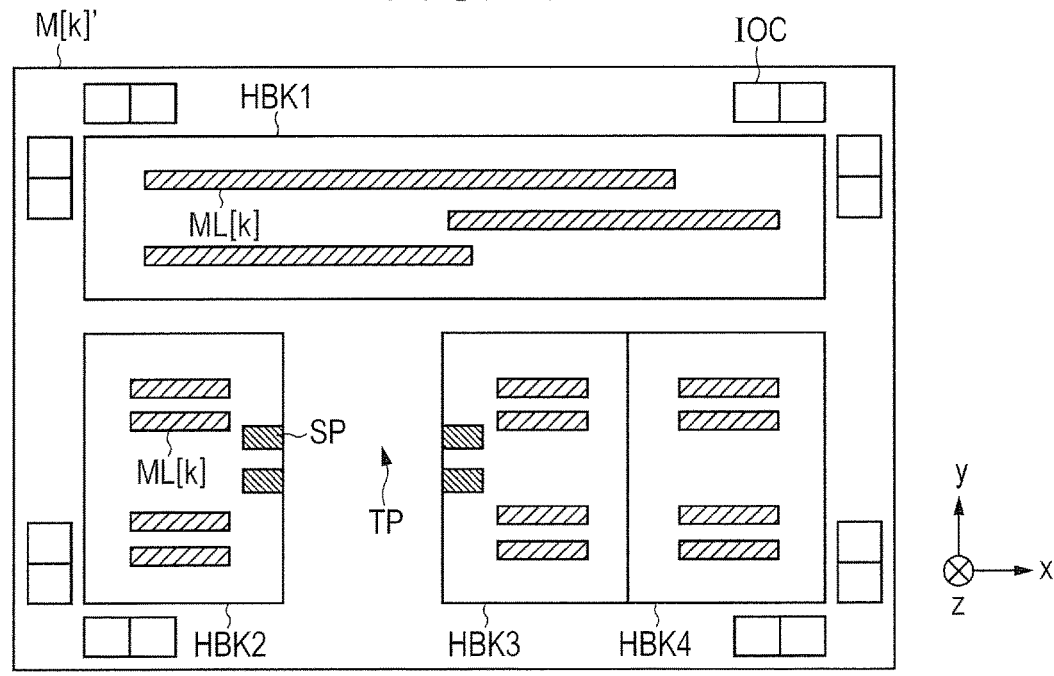
FIG. 17A is a plan view illustrating an example of a layout configuration of a metal wiring layer in a semiconductor device discussed as a comparative example of the invention.
Figure 17B:
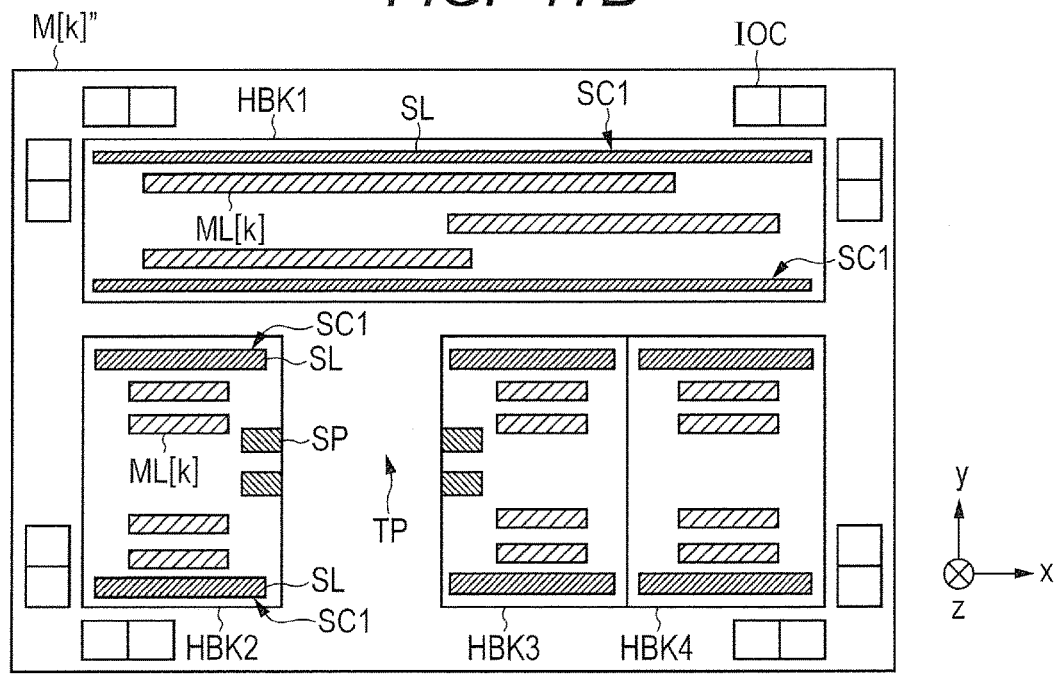
FIG. 17B is a plan view illustrating an example of a layout configuration of a metal wiring layer in a semiconductor device discussed as a comparative example of the invention.

Each of FIGS. 17A and 17B is a plan view illustrating an example of a layout configuration of a metal wiring layer in a semiconductor device discussed as a comparative example of the present invention. In a metal wiring layer M[k]' illustrated in FIG. 17A, each of the hierarchical blocks HBK1 to HBK4 does not include the shield ring wire SR, unlike the case of FIG. 3A. On the other hand, in a metal wiring layer M[k]" illustrated in FIG. 17B, each of the hierarchical blocks HBK1 to HBK4 includes the shield wire SL. However, the shield wire SL has the section SC1 extending in the preferential direction but does not have the section SC2 extending in the non-preferential direction, unlike the case of FIG. 3A.

Figure 18:
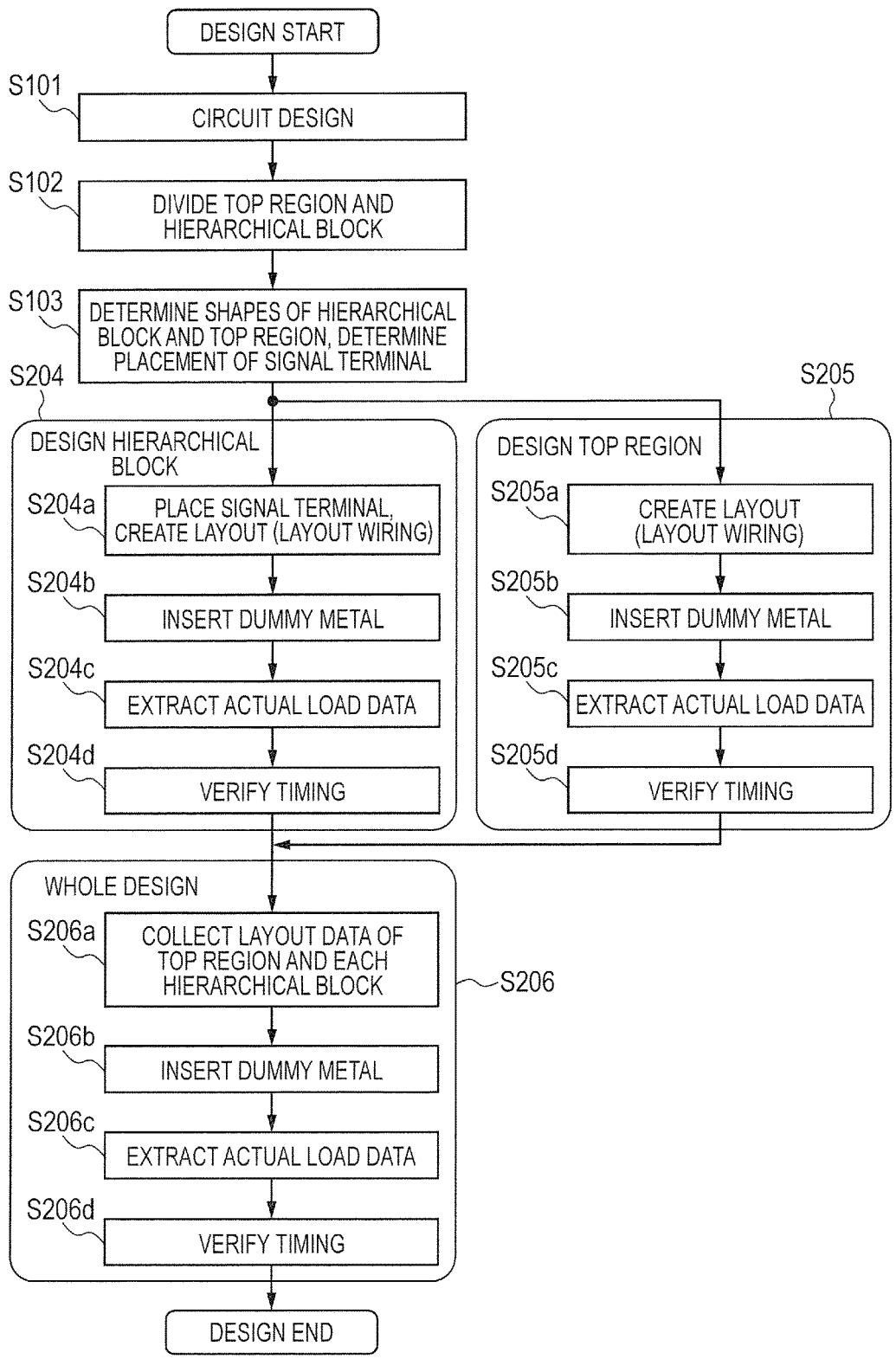
FIG. 18 is a flow chart illustrating an example of a designing method for a semiconductor device of FIG. 17A.

FIG. 18 is a flow chart illustrating an example of a designing method for a semiconductor device of FIG. 17A. In FIG. 18, a designer first designs circuits of a semiconductor device (semiconductor chip) and generates circuit data, such as a netlist (Step S101). Subsequently, a designer divides the semiconductor device into the top region TP and the hierarchical blocks HBK1 to HBK4 in order to perform layout designing by a hierarchical layout designing technique (Step S102).

Subsequently, a designer determines the shape of each of the hierarchical blocks HBK1 to HBK4 and the placement of the signal terminal SP in the process of the floor plan of the whole semiconductor chip, etc., and determines the shape of the top region TP (Step S103). Then, respective designers design, respectively and in parallel, the layout of the top region TP and those of the hierarchical blocks HBK1 to HBK4 determined in Step S103 (Steps S204 and S205).

In designing the hierarchical block (Step S204), a designer first places the signal terminal SP in a target hierarchical block, and creates the layout of a circuit included in the target hierarchical block by layout wiring using an automatic layout wiring tool, or the like (Step S204a). Subsequently, a designer inserts a dummy metal into the metal wiring layer of the target hierarchical block by using a predetermined design tool (Step S204b). The dummy metal is inserted for the purpose of flattening each metal wiring layer in a CMP (Chemical Mechanical Polishing) step, one step of a manufacturing process.

Subsequently, a designer extracts actual load data, such as wire resistance and wire capacitance, on the hierarchical block into which the dummy metal has been inserted, by using a predetermined design tool (Step S204c). Thereafter, a designer verifies the timing of the target hierarchical block by using the extracted actual load data (Step S204d). A designer also verifies a layout rule for the target hierarchical block.

On the other hand, in designing the top region TP (Step S205), a designer first creates the layout of a circuit including the top region TP by an automatic layout wiring tool, or the like (Step S205a). In this case, the designer designs the top region TP in a state where, for example, the signal terminal SP of each of the hierarchical blocks adjacent to the top region TP is being referred to as frame data, and creates the layout of wires for mainly coupling the signal terminals SP to each other.

Subsequently, a designer inserts a dummy metal into the metal wiring layer of the top region TP by using a predetermined design tool (Step S205b). Subsequently, a designer extracts the actual load data, such as wire resistance and wire capacitance, on the top region TP into which the dummy metal has been inserted, by using a predetermined design tool (Step S205c). Thereafter, a designer verifies the timing of the top region TP by using the extracted actual load data (Step S205d). A designer also verifies a layout rule for the top region TP.

Subsequently, a designer designs the whole layout of a combination of the top region TP and the hierarchical blocks HBK1 to HBK4 designed in Steps S204 and S205 (Step S206). Specifically, a designer first collects layout data on the top region TP and the hierarchical blocks HBK1 to HBK4 (Step S206a), and inserts a dummy metal into the layout of the whole chip by the layout data (Step S206b). Subsequently, a designer extracts actual load data from the chip layout into which the dummy metal has been inserted (Step S206c), and verifies the timing of the whole chip by using the actual load data (Step S206d).

Figure 19:
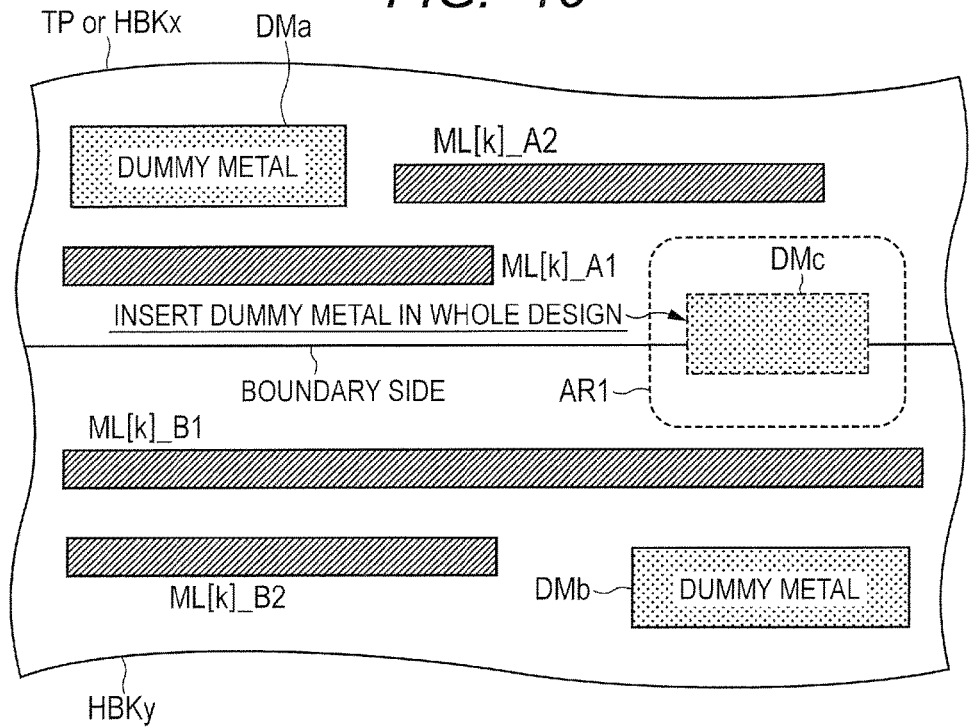
FIG. 19 is an illustrative view illustrating an example of a problem caused when the semiconductor device of FIG. 17A or 17B is used.

FIG. 19 is an illustrative view illustrating an example of a problem caused when the semiconductor device of FIG. 17A or 17B is used. FIG. 19 illustrates an example of a layout configuration of a metal wiring layer around the boundary side between two wiring regions (a hierarchical block HBKy and the top region TP or a hierarchical block HBKx), the wiring regions being placed adjacent to each other as a configuration example.

In the hierarchical block HBKy, metal wires ML[k]_B1 and ML[k]_B2 are formed in the step of Step S204a in FIG. 18, and in addition to that, a dummy metal DMb is inserted in the step of Step S204b. Similarly, in the top region TP or the hierarchical block HBKx, metal wires ML[k]_A1 and ML[k]_A2 are formed in the step of Step S205a or S204a in FIG. 18, and in addition to that, a dummy metal DMa is inserted in the step of Step S205b or S204b.

On the other hand, when these two wiring regions are combined to be placed adjacent to each other, a dummy metal DMc may be inserted into a boundary region AR1 in the step of Step S206b in FIG. 18. A design tool includes, for example, a wiring density rule, a blank space rule, and the like, as rules for automatically inserting a dummy metal. The wiring density rule is for keeping the density of metal wires within a range between specified minimum and maximum values. The blank space rule is for including metal wires within a certain area. The dummy metal is not particularly limited, but set to a floating voltage, or the like.

Herein, when attention is paid to the region AR1 in FIG. 19 and only one of the two wiring regions in FIG. 19 is to be designed, a space large enough to violate the blank space rule does not exist in the gap with the boundary side, and hence a dummy metal is not inserted in Step S204b in FIG. 18, etc. However, when a combination of the two wiring regions is to be designed, a space large enough to violate the blank space rule is generated in the region AR1, and hence a situation may occur in which the dummy metal DMc is inserted in Step S206b in FIG. 18. This will eventually decrease the accuracy of extracting the actual load data in a boundary portion, in Steps S204c and S205c in FIG. 18.

In the semiconductor device of FIG. 17A, there is the fear that such a situation may occur in each boundary side of each of the hierarchical blocks HBK1 to HBK4, while in the semiconductor device of FIG. 17B, there is the fear that it may occur in the boundary side not having the shield wire SL of each of the hierarchical blocks HBK1 to HBK4. If it is intended not to insert a dummy metal itself into the boundary side not having the shield wire SL, a problem may be caused in the above flattening of the metal wiring layer.

If the dummy metal DMc is thus inserted in Step S206b in FIG. 18, the layout of the two wiring regions is changed itself in the boundary portion in FIG. 19. Accordingly, the step of extracting actual load data is again required in Step S206c in FIG. 18. However, the step is performed for the whole chip, unlike the case of each of Steps S204c and S205c, and hence there is the fear that the amount of data to be handled may be large and it may take a lot of time to process a design tool.

Further, if the dummy metal DMc is inserted in Step S206b, there is the possibility that a situation may occur in the step of verifying timing in the subsequent Step S206d, in which because of the insertion thereof, a timing constraint is not met. In such a case, there is the fear in the worst case scenario that rework back to the steps of Steps S204 and S205 may be required and a design period may be greatly prolonged.

Figure 20:
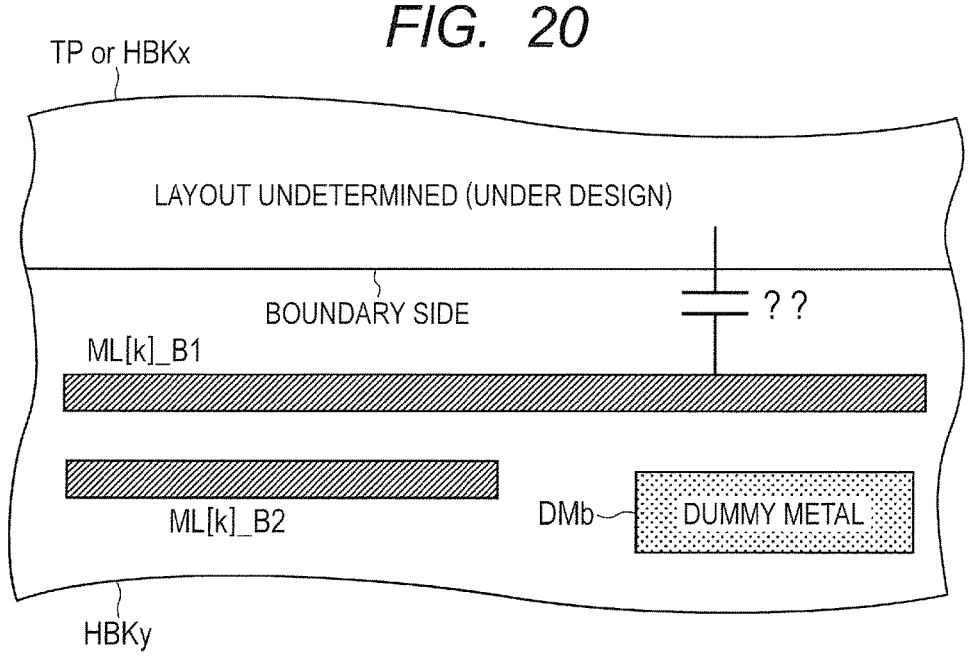
FIG. 20 is an illustrative view illustrating an example of another problem caused when the semiconductor device of FIG. 17A is used.

FIG. 20 is an illustrative view illustrating an example of another problem caused when the semiconductor device of FIG. 17A is used. FIG. 20 illustrates an example of a layout configuration of a metal wiring layer around the boundary side between two wiring regions (the hierarchical block HBKy and the top region TP or the hierarchical block HBKx), the wiring regions being placed adjacent to each other as a configuration example, like the case of FIG. 19.

In FIG. 20, when the two wiring regions are designed in parallel, a designer in charge of one of the wiring regions (herein, hierarchical block HBKy) is required to design in a state where the layout of the other wiring region (top region TP or hierarchical block HBKx) is undetermined. In this case, for example, the actual load data (e.g., parasitic capacitance, etc.) on the metal wire ML[k]_B1 for signal transmission, the metal wire ML[k]_B1 being adjacent to a boundary side, varies depending on the layout of a boundary portion in the other wiring region. As a result, it may become difficult to extract the actual load data in the boundary portion with a high degree of accuracy in Step S204c (the same with Step S205c) in FIG. 18.

There is the fear in the semiconductor device of FIG. 17A that such a situation may occur in each boundary side of each of the hierarchical blocks HBK1 to HBK4. On the other hand, in the semiconductor device of FIG. 17B, there is the possibility that such a situation may occur in the side having the signal terminal SP of each of the hierarchical blocks HBK1 to HBK4. Herein, if the vicinity of the side having the signal terminal SP is determined as a wiring inhibition region, the situation described with reference to FIG. 20 may not particularly be a problem. In this case, however, a dummy metal cannot be inserted, and hence a problem may occur in the flattening of the metal wiring layer.

When the accuracy of extracting the actual load data is thus decreased in Steps S204c and S205c in FIG. 18, the step of extracting actual load data is again required in Step S206c. In that case, there is the fear that it may take a lot of time to process a design tool, like the case of FIG. 19.

Additionally, in the step of verifying timing in Step S206d, a situation may occur in which a timing constraint is not met, for example, because of an increase in the parasitic capacitance of the metal wire ML[k]_B1, etc. In addition to such a timing constraint, another situation may further occur in which a crosstalk noise specification is not met, for example, because of an increase in the coupling capacity of the metal wire ML[k]_B1. In the case, there is the fear that rework of design may occur and a design period may be greatly prolonged, like the case of FIG. 19. So, it becomes beneficial to use the semiconductor device as illustrated in FIG. 3A and FIG. 3B and the designing method of a semiconductor device as illustrated in FIG. 5.

<<Designing Method of Semiconductor Device (First Embodiment)>>

Figure 5:
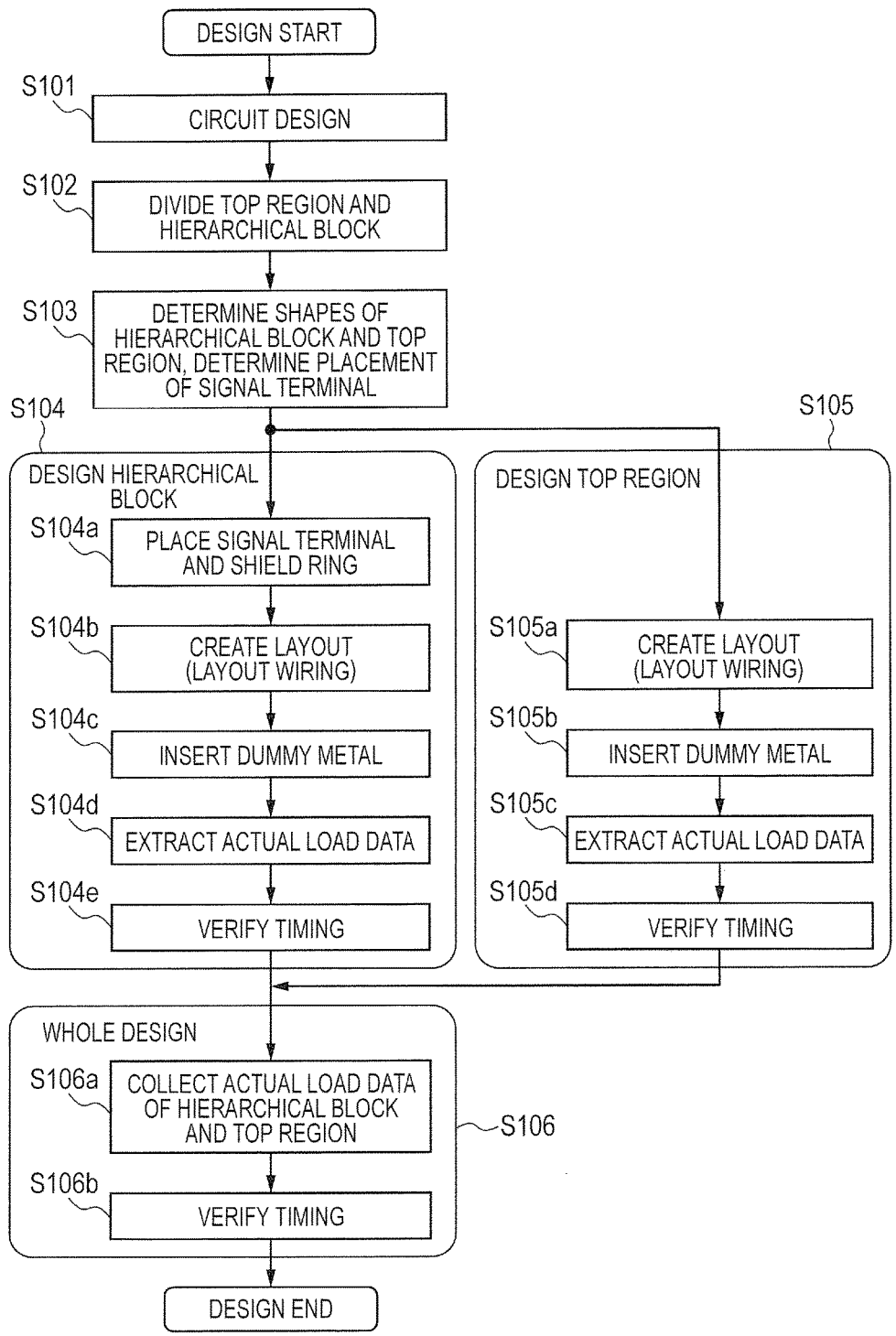
FIG. 5 is a flow chart illustrating an example of a designing method for a semiconductor device of FIGS. 3A and 3B.

FIG. 5 is a flow chart illustrating an example of a designing method for the semiconductor device of FIGS. 3A and 3B. In FIG. 5, a designer designs, after the steps of Steps S101 to S103, the layouts of the top region TP and the hierarchical blocks HBK1 to HBK4 determined in Step S103 in parallel to each other (Steps S104 and S105), like the case of FIG. 18.

In designing the hierarchical blocks (Step S104), a designer first places the shield ring wire SR so as to extend along the outer periphery of the metal wiring layer of a target hierarchical block, by using a predetermined design tool (Step S104a). A designer also places the signal terminal SP to be coupled to the top region TP (or another hierarchical block), in the signal terminal section SC3 that is a partial section of at least any one of the sides extending in the non-preferential direction, the sides serving as the boundaries of the target hierarchical block, by using a predetermined design tool (Step S104a).

Thereafter, a designer performs the steps of Steps S104b to S104e by using a predetermined design tool, like the cases of Steps S204a to S204d in FIG. 18. To briefly explain, the layout of a circuit is created by layout wiring in Step S104b, and a dummy metal is inserted in Step S104c. Actual load data is extracted in Step S104d, and timing is verified in Step S104e.

On the other hand, in designing the top region TP (Step S105), a designer performs the steps of Step S105a to S105d by using a predetermined design tool, like the cases of Steps S205a to S205d in FIG. 18. To briefly explain, the layout of a circuit is created by layout wiring in Step S105a, and a dummy metal is inserted in Step S105b. Actual load data is extracted in Step S105c, and timing is verified in Step S105d.

Subsequently, a designer designs the whole layout of a combination of the top region TP and the hierarchical blocks HBK1 to HBK4 designed in Steps S104 and S105 (Step S106). In this case, the designer first collects the actual load data on the hierarchical blocks HBK1 to HBK4 and the top region TP extracted in Steps S104d and S105c (Step S106a), unlike the case of FIG. 18. Then, a designer verifies the timing of the whole chips by using the collected actual load data and a predetermined design tool (Step S106b).

<<Main Advantages of Present First Embodiment>>

Figure 6:
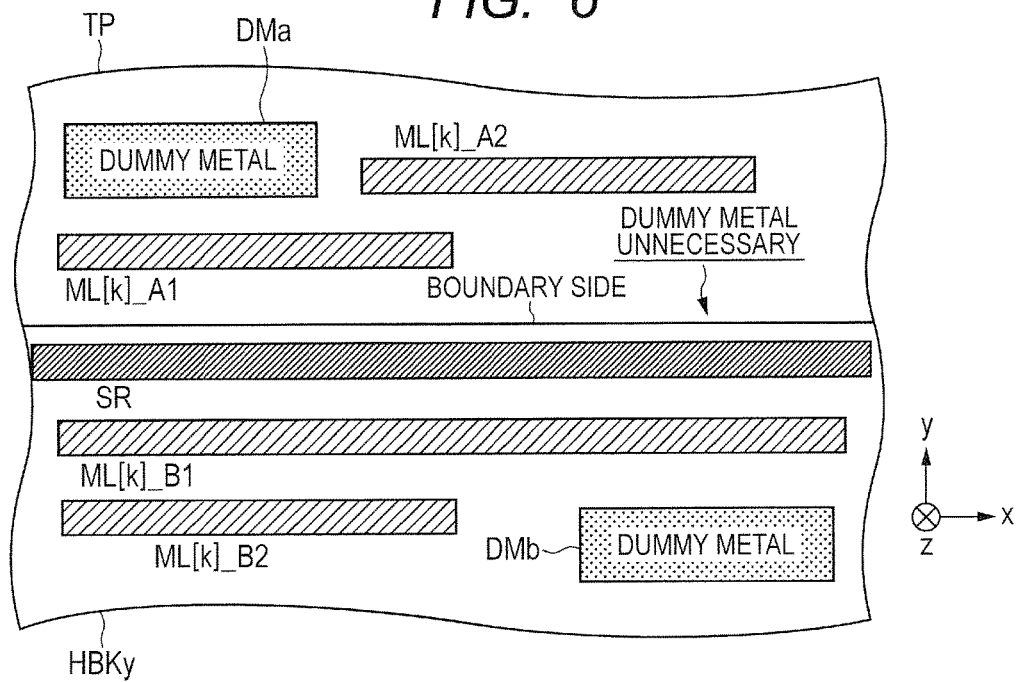
FIG. 6 is an illustrative view illustrating an example of an advantage obtained when the semiconductor device of FIGS. 3A and 3B is used.

FIG. 6 is an illustrative view illustrating an example of an advantage obtained when the semiconductor device of FIGS. 3A and 3B is used. FIG. 6 illustrates an example of a layout configuration of a metal wiring layer around the boundary side between two wiring regions (the hierarchical block HBKy and the top region TP), the wiring regions being placed adjacent to each other as a configuration example, like the case of FIG. 19. In the hierarchical block HBKy, the shield ring wire SR is provided between the metal wire ML[k]_B1 and the boundary side, unlike the case of FIG. 19.

In the stage of designing the hierarchical block HBKy, the space between the shield ring wire SR and the boundary side is determined to be an approximate value at which any metal wire (including a dummy metal) is not automatically inserted within the space. Although not necessarily limited, the space is a minimum space, etc., determined, for example, by the layout rule.

Thus, a blank space large enough to violate the blank space rule is not generated in the boundary portion by providing the shield ring wire SR, even when the two wiring regions is combined, unlike the case of FIG. 19. Thereby, the necessity of inserting a dummy metal into a boundary portion can be eliminated itself, and as illustrated in Step S106 in FIG. 5, the step of inserting a dummy metal (Step S206b in FIG. 18) also becomes unnecessary in the whole designing. Further, along with this, the step of extracting actual load data again (Step S206c in FIG. 18) also becomes unnecessary, and as illustrated in Step S106 in FIG. 5, timing can be verified by using the actual load data extracted in Steps S104 and S105 as they are.

As a result, in the stage of hierarchical layout designing (i.e., Steps S104d and S105c in FIG. 5), the actual load data on each of the hierarchical blocks can be extracted with a high degree of accuracy, as a substantial advantage. Furthermore, along with this, a design period can be greatly reduced in comparison with the case of FIG. 19. Specifically, the steps of Steps S206b and S206c in FIG. 18 can be removed, and in addition to this, rework back to the steps of Steps S104 and S105 can be eliminated.

Figure 7:
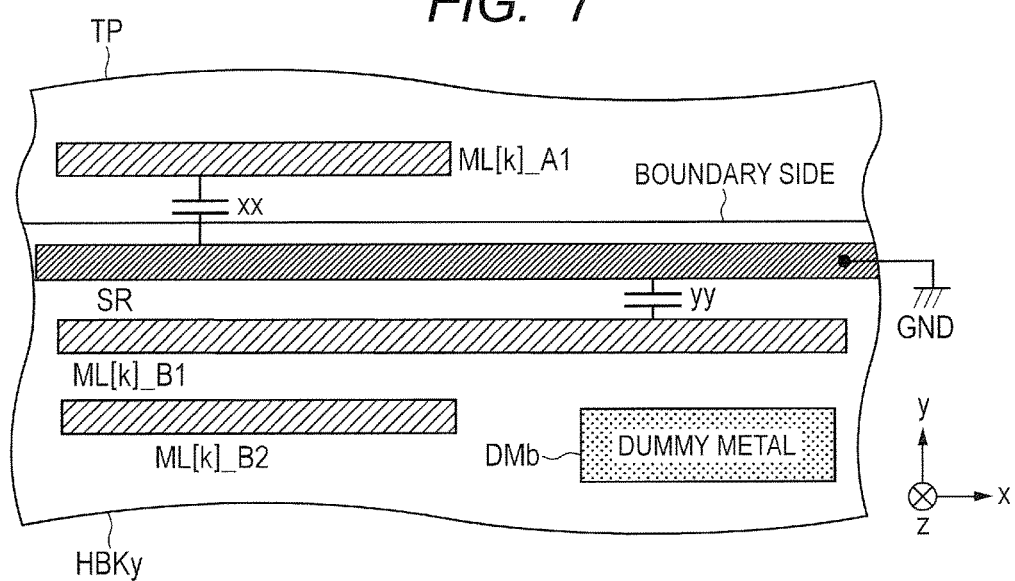
FIG. 7 is an illustrative view illustrating an example of another advantage obtained when the semiconductor device of FIGS. 3A and 3B is used.

FIG. 7 is an illustrative view illustrating an example of another advantage obtained when the semiconductor device of FIGS. 3A and 3B is used. FIG. 7 illustrates an example of a layout configuration of a metal wiring layer around the boundary side between two wiring regions (the hierarchical block HBKy and the top region TP), the wiring regions being placed adjacent to each other as a configuration example, like the case of FIG. 20. In the hierarchical block HBKy, however, the shield ring wire SR is provided between the metal wire ML[k]_B1 and the boundary side to which the power supply voltage GND on a low potential side is to be applied, unlike the case of FIG. 20.

In FIG. 7, the case is first assumed where the hierarchical block HBKy is designed in a state in which the layout of the top region TP is undetermined. In this case, the actual load data on the metal wire ML[k]_B1 for signal transmission is not dependent on the layout of the top region TP, unlike the case of FIG. 20, and can be determined by using, for example, a capacitance (yy) with the shield ring wire SR, etc. Additionally, the power supply voltage GND is applied to the shield ring wire SR, and hence crosstalk noise between the metal wire ML[k]_B1 and the top region TP is shielded by the shield ring wire SR.

Subsequently, the case is assumed where the top region TP is designed in a state in which the layout of the hierarchical block HBKy is undetermined. In this case, the actual load data on the metal wire ML[k]_A1 for signal transmission can be determined by using, for example, a capacitance (xx) with the shield ring wire SR in the hierarchical block HBKy, etc. Additionally, crosstalk noise between the metal wire ML[k]_A1 and the hierarchical block HBKy is shielded by the shield ring wire SR in the hierarchical block HBKy. Specifically, assuming that the shield ring wire SR is provided in the adjacent hierarchical block, the top region TP may be designed by referring to the shield ring wire SR as frame data.

Thereby, the actual load data on each of the hierarchical blocks can be extracted with a high degree of accuracy in the stage of hierarchical layout designing (i.e., Steps S104d and S105 in FIG. 5). Further, along with this, a design period can be greatly reduced in comparison with the case of FIG. 20. Specifically, the steps of Steps S206b and S206c in FIG. 18 can be removed, and in addition to this, rework back to the steps of Steps S104 and S105 can be eliminated, like the case of FIG. 6.

(Second Embodiment)
<<Layout of Hierarchical Block (Application Example [1A])>>

Figure 8A:
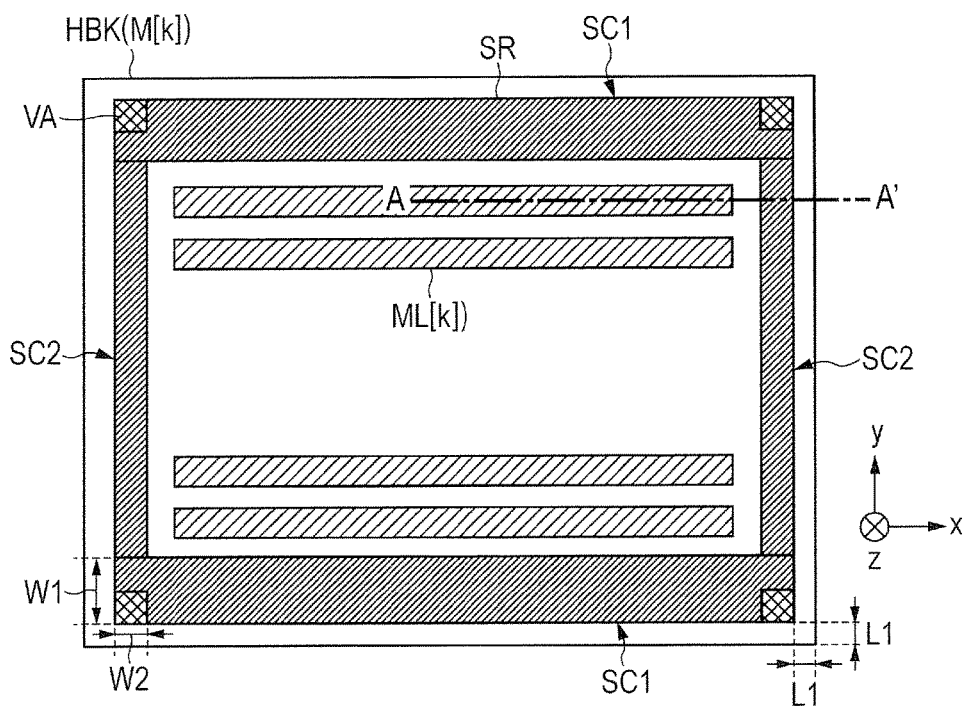
FIG. 8A is a plan view illustrating an example of a schematic layout configuration of each hierarchical block in a metal wiring layer in a semiconductor device according to Second Embodiment of the invention.
Figure 8B:
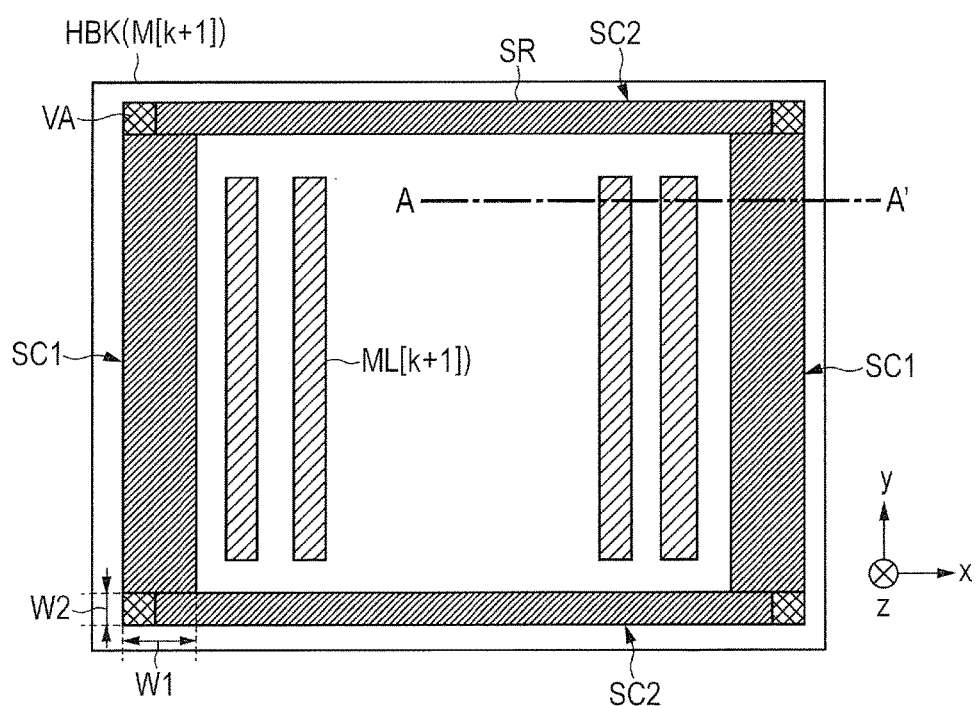
FIG. 8B is a plan view illustrating an example of a schematic layout configuration of each hierarchical block in a metal wiring layer in the semiconductor device according to Second Embodiment of the invention.

Each of FIGS. 8A and 8B is a plan view illustrating an example of a schematic layout configuration of each hierarchical block in a metal wiring layer in a semiconductor device according to Second Embodiment of the present invention. The hierarchical block HBK illustrated in FIG. 8A corresponds to each of the hierarchical blocks HBK1 to HBK4 in the metal wiring layer M[k] illustrated in FIG. 3A. Similarly, the hierarchical block HBK illustrated in FIG. 8B corresponds to each of the hierarchical blocks HBK1 to HBK4 in the metal wiring layer M[k+1] illustrated in FIG. 3B.

The hierarchical block HBK illustrated in FIGS. 8A and 8B has a shield ring wire SR formed by a single metal wire, like the cases of FIGS. 3A and 3B. However, a wire width W1 of the shield ring wire SR in the section SC1 extending in the preferential direction is larger than a wire width W2 thereof in the section SC2 extending in the non-preferential direction, unlike the case of each of FIGS. 3A and 3B. Herein, the space L1 between the boundary side of the hierarchical block HBK and the shield ring wire SR is constant regardless of the section SC1 or SC2. Additionally, in the example of each of FIGS. 8A and 8B, a via VA for coupling, between the metal wiring layers M[k] and M[k+1], the shield ring wires SR in FIGS. 8A and 8B together is provided, although not particularly limited. In this example, the via VA is provided in each of the intersections between the section SC1 and the section SC2.

Figure 9A:
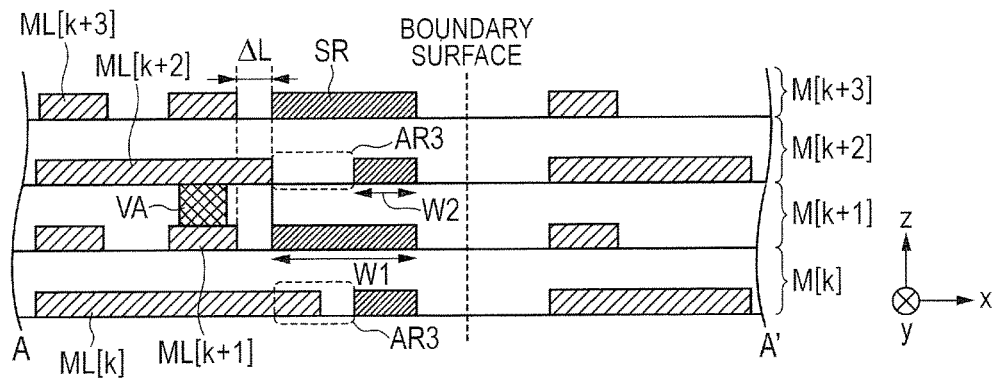
FIG. 9A is an illustrative view illustrating an example of an advantage of a semiconductor device of FIGS. 8A and 8B, which is also a sectional view illustrating an example of a structure between A-A' in FIGS. 8A and 8B.
Figure 9B:
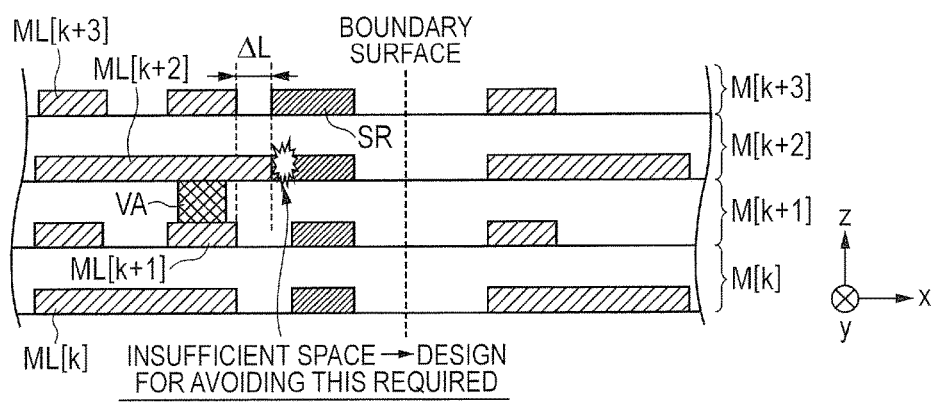
FIG. 9B is a sectional view illustrating an example of a structure of a semiconductor device of a comparative example of FIG. 9A.
Figure 9C:
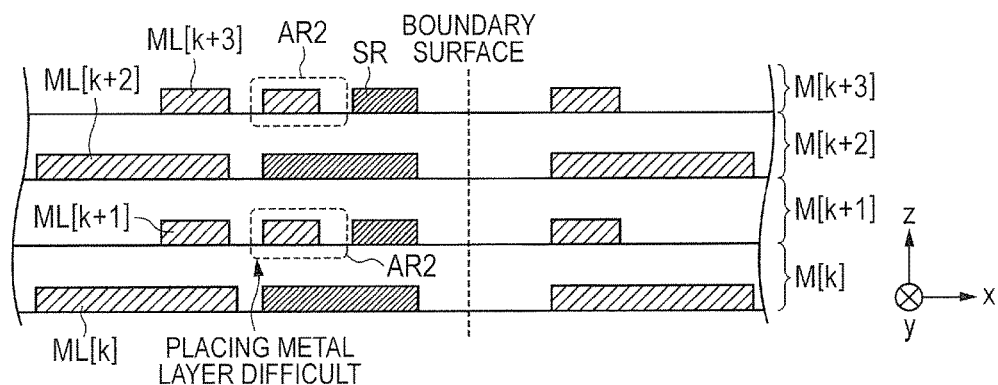
FIG. 9C is a sectional view illustrating an example of a structure of a semiconductor device of a comparative example of FIG. 9A.

<<Main Advantages of Second Embodiment>>
As described above, the following advantages can be further obtained in addition to the various advantages described in First Embodiment, by using the semiconductor device according to Second Embodiment. FIG. 9A is an illustrative view illustrating an example of an advantage of the semiconductor device of FIGS. 8A and 8B, which is also a sectional view illustrating an example of a structure between A-A' in FIGS. 8A and 8B. Each of FIGS. 9B and 9C is a sectional view illustrating an example of a structure of a semiconductor device of a comparative example of FIG. 9A. Each of FIGS. 9A, 9B, and 9C illustrates examples of structures of both the metal wiring layers M[k] and M[k+1] respectively corresponding to FIGS. 8A and 8B and metal wiring layers M[k+2] and M[k+3] located over the metal wiring layer M[k+1].

First, FIG. 9B illustrates an example of a structure in which the wire widths of the shield ring wire SR in the sections SC1 and SC2 are equal to each other. Herein, the case is assumed where the metal wire ML[k+1] and the metal wire ML[k+2] are coupled together through the via VA, for example, in a place adjacent to the shield ring wire SR. In this case, it may be necessary to extend, for example, the metal wire ML[k+2] by ΔL toward the side on which the shield ring wire SR exists, because the via VA is provided.

Then, the case may occur where the space between the metal wire ML[k+2] and the shield ring wire SR becomes insufficient and the layout rule is violated. Accordingly, a designer is required to pay attention so that, for example, the position of the via VA is changed or the position of the metal wire ML[k+2] is shifted, in order to avoid such violation of the layout rule, and hence there is the fear that the burden for a designer may be increased.

Contrary to FIGS. 8A and 8B, FIG. 9C illustrates an example of a structure in which the wire width in the section SC2 is larger than that in the section SC1. In this case, the metal wires ML[k+1] and ML[k+3] can be placed in a region AR2 generated because of the difference between these wire widths. However, the metal wire (e.g., ML[k+1]) extends in a y axis direction that is a preferential direction in principle, and hence it is difficult to place the metal wire into the upper and lower metal wires (ML[k] and ML[k+2]) through the via VA. As a result, the region AR2 may not be sufficiently utilized, and there is the fear that layout area efficiency may be decreased.

(Advantage 1)

In FIG. 9A, a certain degree of space is secured between the metal wire ML[k+2] and the shield ring wire SR, because of the difference between the wire widths in the sections SC1 and SC2, unlike the case of FIG. 9B. Accordingly, the layout rule is not violated even when the same via VA as in FIG. 9B is provided. As a result, the burden for a designer, etc., can be reduced, and for example, layout designing, etc., can be easily performed.

(Advantage 2)

In FIG. 9A, the metal wires ML[k] and ML[k+2] can be placed in a region AR3 generated because of the difference between the wire widths in the sections SC1 and SC2. The preferential direction of each of the metal wires is an x axis direction, unlike the case of FIG. 9C, and hence it is also easy to place the metal wire (e.g., ML[k+2]) into the upper and lower metal wires (ML[k+1], ML[k+3]) through the via VA. As a result, the region AR3 can be sufficiently and effectively utilized, and for example, layout area efficiency, etc., can be improved in comparison with the case of FIG. 9C.

(Advantage 3)

As can be seen from the comparison between FIGS. 9A and 9B, the shield ring wire SR, the wire width of which is larger than that in FIG. 9B, is provided, for example, in parallel and next to the metal wire ML[k+3] extending in the y axis direction in FIG. 9A. As a result, the resistance of the shield ring wire SR is reduced to a smaller level than that in FIG. 9B, and the advantage of reducing the crosstalk noise, which has been described in FIG. 7, can be more improved.

(Advantage 4)

The parasitic capacitance of the metal wire ML[k+3] in FIG. 9B is greatly affected, for example, by the capacitance of the space with the shield ring wire SR in the same metal wiring layer M[k+3]) (i.e., the capacitance of an interlayer insulating film in the metal wiring layer M[k+3]). In some cases, however, the parasitic capacitance thereof may be affected, in addition to that, also by the capacitance of an interlayer insulating film in the metal wiring layer M[k+2], etc. That is, the parasitic capacitance may appear not only in a lateral direction (and a longitudinal direction) but also in an oblique direction. In this case, the actual load data becomes slightly dependent on the layout of a region beyond a boundary surface, and there is the fear that the accuracy of extracting the actual load data in Steps S104$d$ and S105$c$ in FIG. 5 may be slightly decreased. The decrease in the extraction accuracy may be more remarkable, particularly as the values (thickness/width) of the metal wire become larger.

On the other hand, in FIG. 9A, a sufficient space (wire width W1) can be secured in the placement place by expanding the wire width of the shield ring wire SR in comparison with the case of FIG. 9B. Accordingly, the parasitic capacitance in an oblique direction can also be determined within a range not exceeding the placement region for the shield ring wire SR, without being dependent on the region beyond the boundary surface. As a result, the accuracy of extracting actual load data in Steps S104$d$ and S105$c$ in FIG. 5 can be more improved than that in First Embodiment.

(Advantage 5)

There is the tendency that the density of metal wires is generally decreased in a boundary portion. In this case, in automatically inserting a dummy metal around the boundary side illustrated in FIG. 6, the above blank space rule can be avoided, but the wiring density rule may not be avoided. When the wire width of the shield ring wire SR is expanded, the wiring density near the boundary side can be increased, and hence the wiring density rule can be sufficiently avoided.

(Third Embodiment)

<<LAYOUT OF HIERARCHICAL BLOCK (APPLICATION EXAMPLE [1B])>>

Figure 10A:
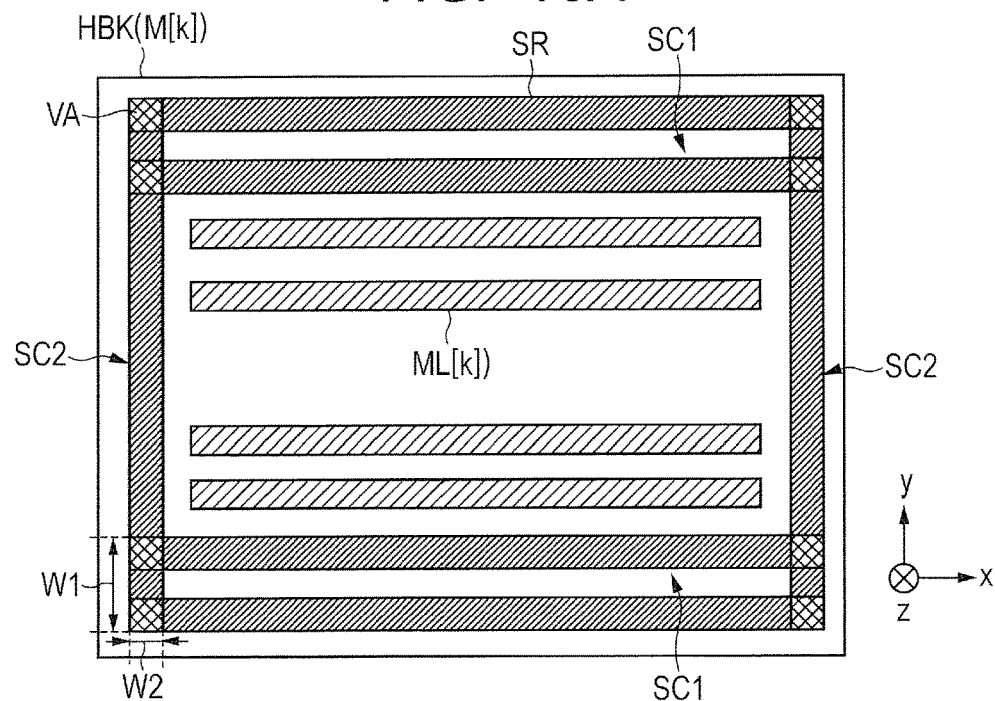
FIG. 10A is a plan view illustrating an example of a schematic layout configuration of each hierarchical block in a metal wiring layer in a semiconductor device according to Third Embodiment of the invention.
Figure 10B:
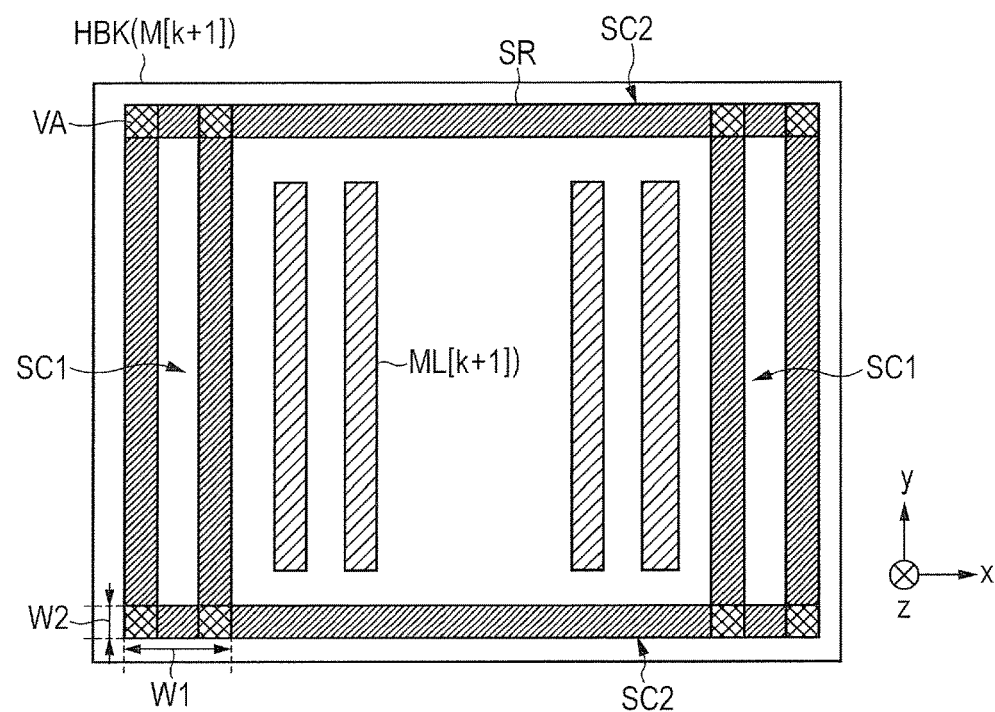
FIG. 10B is a plan view illustrating an example of a schematic layout configuration of each hierarchical block in a metal wiring layer in the semiconductor device according to Third Embodiment of the invention.

Each of FIGS. 10A and 10B is a plan view illustrating an example of a schematic layout configuration of each hierarchical block in a metal wiring layer in a semiconductor device according to Third Embodiment of the present invention. The hierarchical blocks HBK illustrated in FIGS. 10A and 10B correspond to the variations of the hierarchical blocks illustrated in FIGS. 8A and 8B, respectively.

The hierarchical block HBK illustrated in each of FIGS. 10A and 10B has the shield ring wire SR, like the cases of FIGS. 8A and 8B. However, the shield ring wire SR is formed by a plurality of metal wires (in this example, two metal wires) extending side by side in a section SC1 extending in the preferential direction, and formed by a single metal wire in a section SC2 extending in the non-preferential direction, unlike the cases of FIGS. 8A and 8B. The metal wires are formed to have the same wire width as each other. As a result, in each of FIGS. 10A and 10B, the wire width W1 of the shield ring wire SR in the section SC1 is larger than the wire width W2 thereof in the section SC2, like the cases of FIGS. 8A and 8B.

By thus providing a difference between the wire widths in the sections SC1 and SC2, the same advantages as the various advantages described in Second Embodiment can be obtained. In addition to this, the following advantages may be obtained. Each of FIGS. 11A and 11B is an illustrative view illustrating an example of an advantage of the semiconductor device of each of FIGS. 10A and 10B.

Figure 11A:
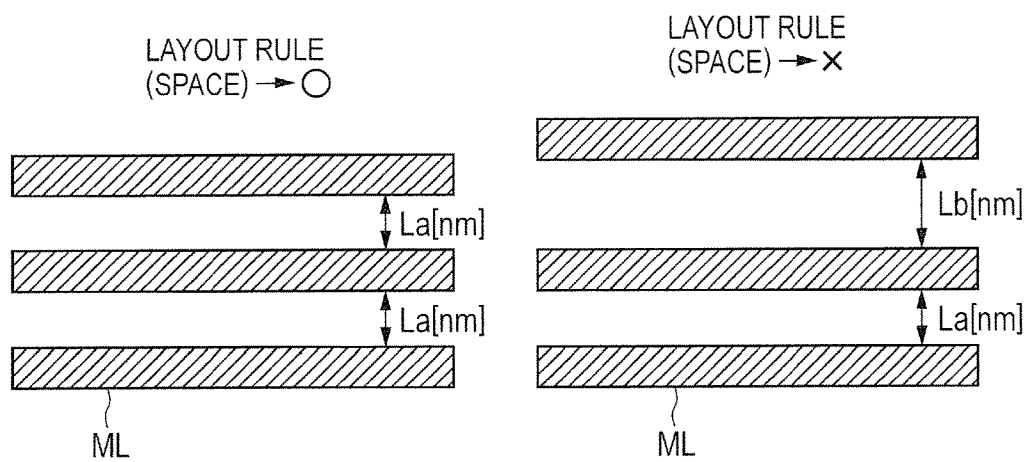
FIG. 11A is an illustrative view illustrating an example of an advantage of a semiconductor device of FIGS. 10A and 10B.

As illustrated in FIG. 11A, the layout rule may include, depending on convenience in the manufacturing process, etc., not only a rule for two metal wires ML adjacent to each other but also a rule for three metal wires ML placed sequentially. In the example of FIG. 11A, for example, the case where the three metal wires ML are sequentially placed at minimum pitches La meets the rule, but the case where they are sequentially placed at the minimum pitch La and a pitch Lb larger than the minimum pitch La violates the rule.

Figure 11B:
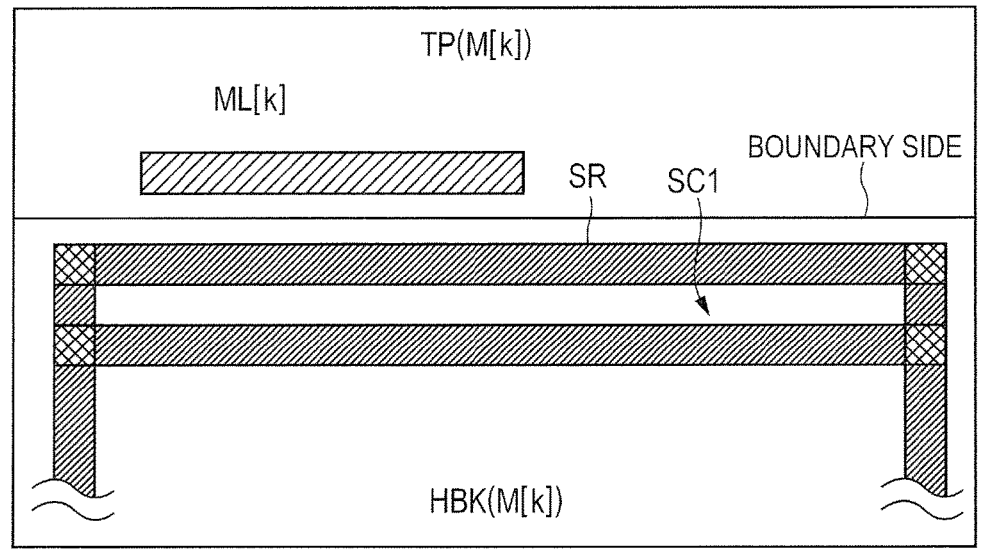
FIG. 11B is an illustrative view illustrating an example of an advantage of the semiconductor device of FIGS. 10A and 10B.

FIG. 11B illustrates an example of a layout configuration of the metal wiring layer M[k] around the boundary side between two wiring regions (hierarchical block HBKy and top region TP), the wiring regions being placed adjacent to each other as a configuration example. The hierarchical block HBK includes a shield ring wire SR formed by two metal wires in a place adjacent to the boundary side.

Herein, the case is assumed where the shield ring wire SR is temporarily formed by a single metal wire. In this case, for example, when the metal wire ML[k] is placed near the boundary side in designing the top region TP, a designer cannot discriminate whether the metal wire ML[k] meets the layout rule of FIG. 11A until the layout of the hierarchical block HBK is completed. On the other hand, when the shield ring wire SR is formed by two metal wires, as illustrated in FIG. 11B, a designer can discriminate, without waiting for the completion of the layout of the hierarchical block HBK, whether the layout rule of FIG. 11A is met, by designing the top region TP on the premise that these two metal wires exist.

Herein, the layout rule as illustrated in FIG. 11A is often applied particularly when each metal wire ML is formed at a minimum line width (e.g., La). Accordingly, the same advantages as in the present Third Embodiment may be obtained also by expanding the wire width of the shield ring wire SR in the section SC1, as in the cases of FIGS. 8A and 8B. In some cases, the shield ring wire SR in the section SC1 may be formed by three or more metal wires, without being limited to two. However, two metal wires are desirable from the viewpoints of circuit area, etc.

Figure 12A:
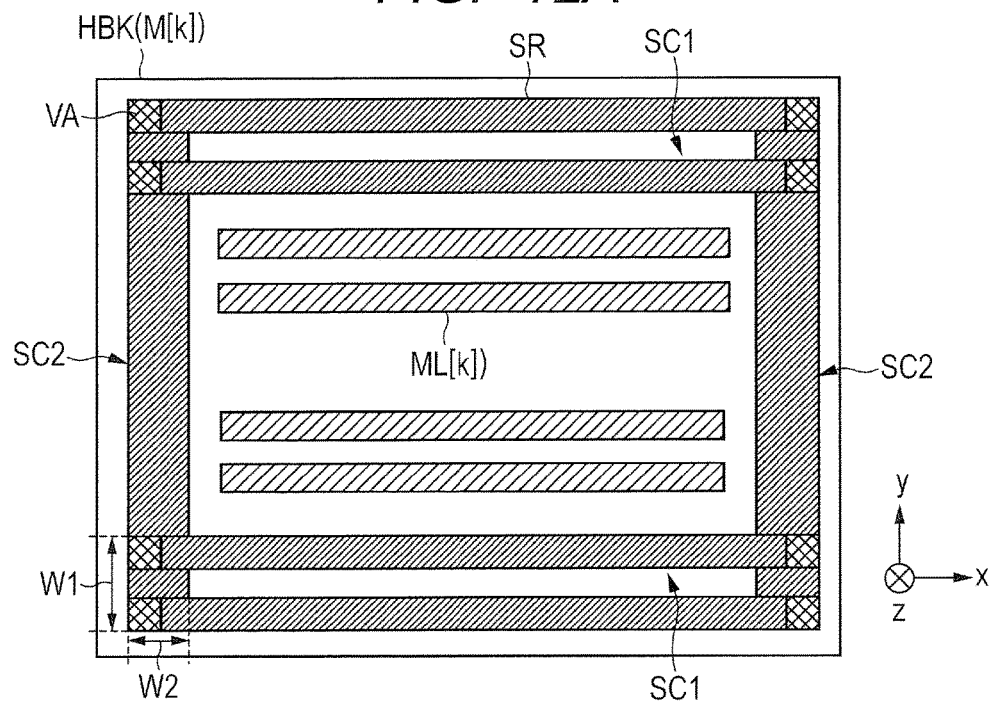
FIG. 12A is a plan view illustrating an example of a layout configuration according to a variation of FIGS. 10A and 10B.
Figure 12B:
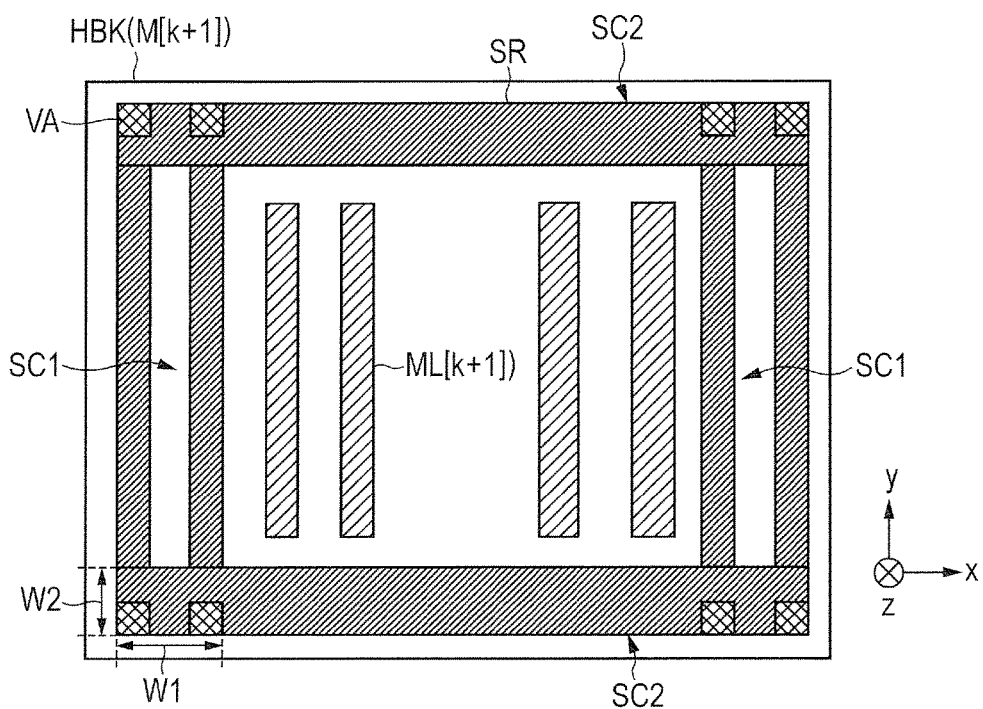
FIG. 12B is a plan view illustrating an example of a layout configuration according to a variation of FIGS. 10A and 10B.

FIGS. 12A and 12B are plan views illustrating examples of layout configurations according to variations of FIGS. 10A and 10B, respectively. In the hierarchical block HBK illustrated in each of FIGS. 12A and 12B, the wire width W2 of the shield ring wire SR in the section SC2 extending in the non-preferential direction is larger than that in the configuration example of each of FIGS. 10A and 10B. However, the relationship that the wire width W1 in the section SC1 is larger than the wire width W2 in the section SC2 is satisfied, like the cases of FIGS. 10A and 10B. Assuming that the minimum line width is La, the wire width W1 is "3×La", etc., and the wire width W2 is "2×La", etc., although not particularly limited.

Depending on a layout rule, it may be required that a metal wire extending in a non-preferential direction be formed to have a wire width larger than a minimum line width. Such a request can be met by adopting the configuration example of each of FIGS. 12A and 12B.

(Fourth Embodiment)

<<Layout of Hierarchical Block (Another Variation)>>

Figure 13A:
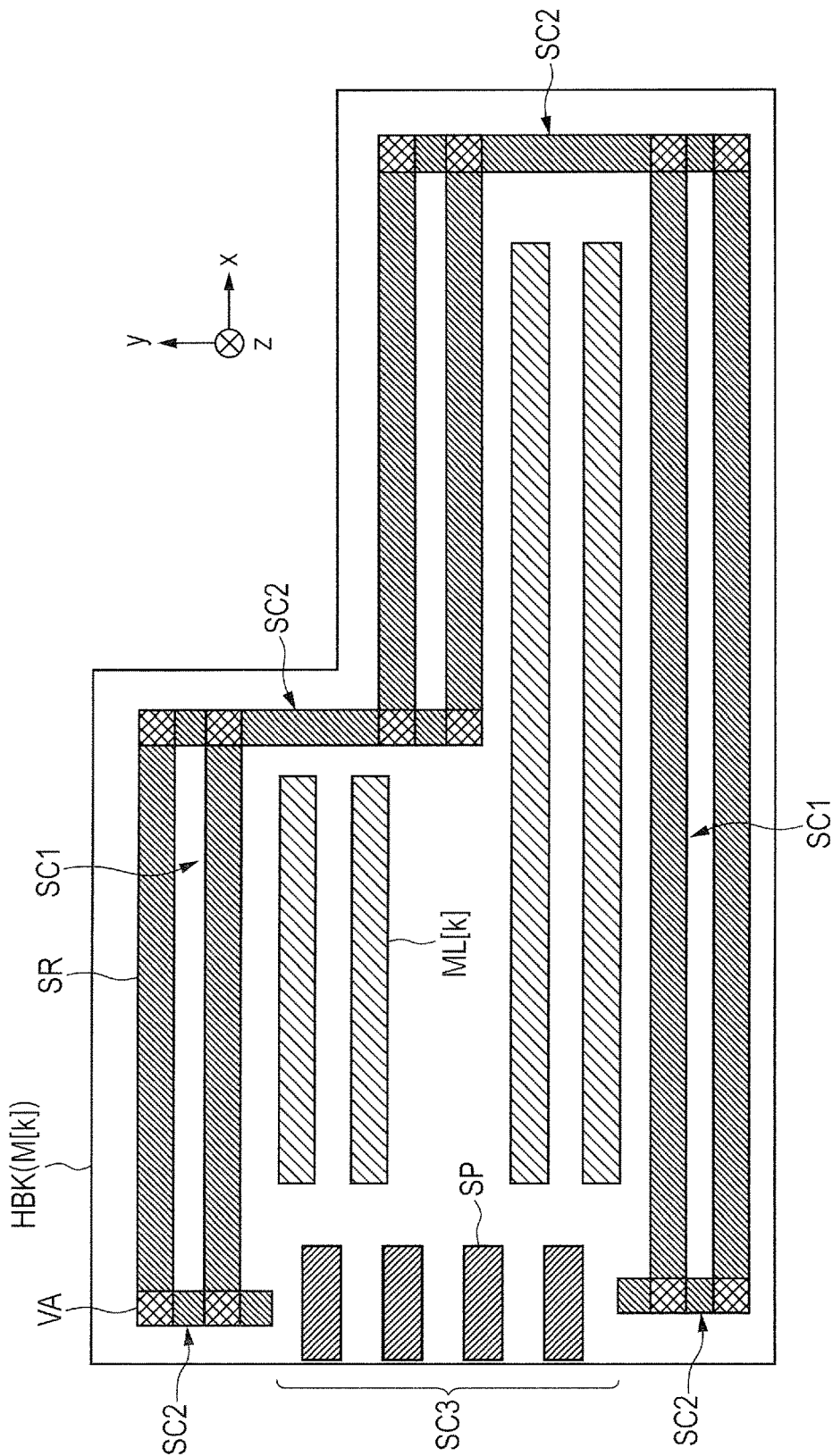
FIG. 13A is a plan view illustrating an example of a schematic layout configuration of each hierarchical block in a metal wiring layer in a semiconductor device according to Fourth Embodiment of the invention.
Figure 13B:
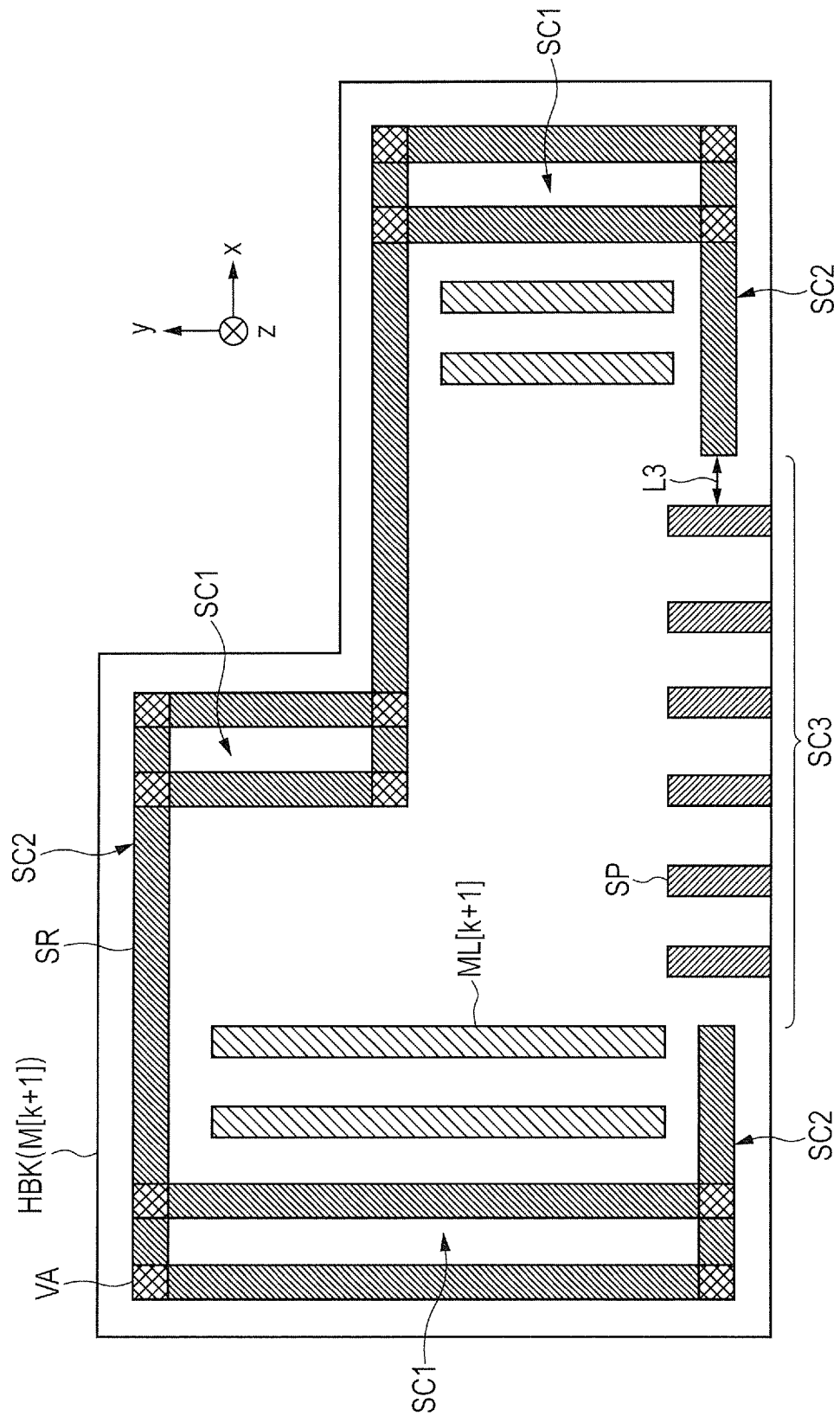
FIG. 13B is a plan view illustrating an example of a schematic layout configuration of each hierarchical block in a metal wiring layer in the semiconductor device according to Fourth Embodiment of the invention.

Each of FIGS. 13A and 13B is a plan view illustrating an example of a schematic layout configuration of each hierarchical block in a metal wiring layer in a semiconductor device according to Fourth Embodiment of the present invention. The hierarchical block HBK illustrated in FIG. 13A corresponds to each of the hierarchical blocks HBK1 to HBK4 in the metal wiring layer M[k] illustrated in FIG. 3A. Similarly, the hierarchical block HBK illustrated in FIG. 13B corresponds to each of the hierarchical blocks HBK1 to HBK4 in the metal wiring layer M[k+1] illustrated in FIG. 3B. Herein, the shield ring wire described in Third Embodiment will be applied.

The shape of each hierarchical block HBK may be a polygon (in this example, hexagon), without being limited to a quadrangle, as illustrated in FIGS. 13A and 13B. Also in this case, the shield ring wire SR is formed by two metal wires in a section SC1 extending in the preferential direction, and formed by a single metal wire in a section SC2 extending in the non-preferential direction, like Third Embodiment. In this example, a signal terminal section SC3 for placing the signal terminal SP is further provided at one of the sides extending in the non-preferential direction. The shield ring wire SR in the section SC2 is placed in the section of the side except the signal terminal section SC3.

Herein, a space L3 between the shield ring wire SR in the section SC2 and the signal terminals SP at one end of the signal terminals SP placed in the signal terminal section SC3 is set to a value at which the blank space rule for dummy metal is met, as illustrated, for example, in FIG. 13B. In detail, the space L3 is larger than or equal to the value determined by the space rule (rule for determining a minimum interval between metal wires) and is smaller than or equal to the value determined by the blank space rule. Thereby, a situation can be avoided even at a side having the signal terminal SP, in which the dummy metal DMc as described with reference to FIG. 19 may be automatically inserted. A dummy metal is not automatically inserted even into the signal terminal section SC3 because of the placement of the signal terminal SP.

Figure 14:
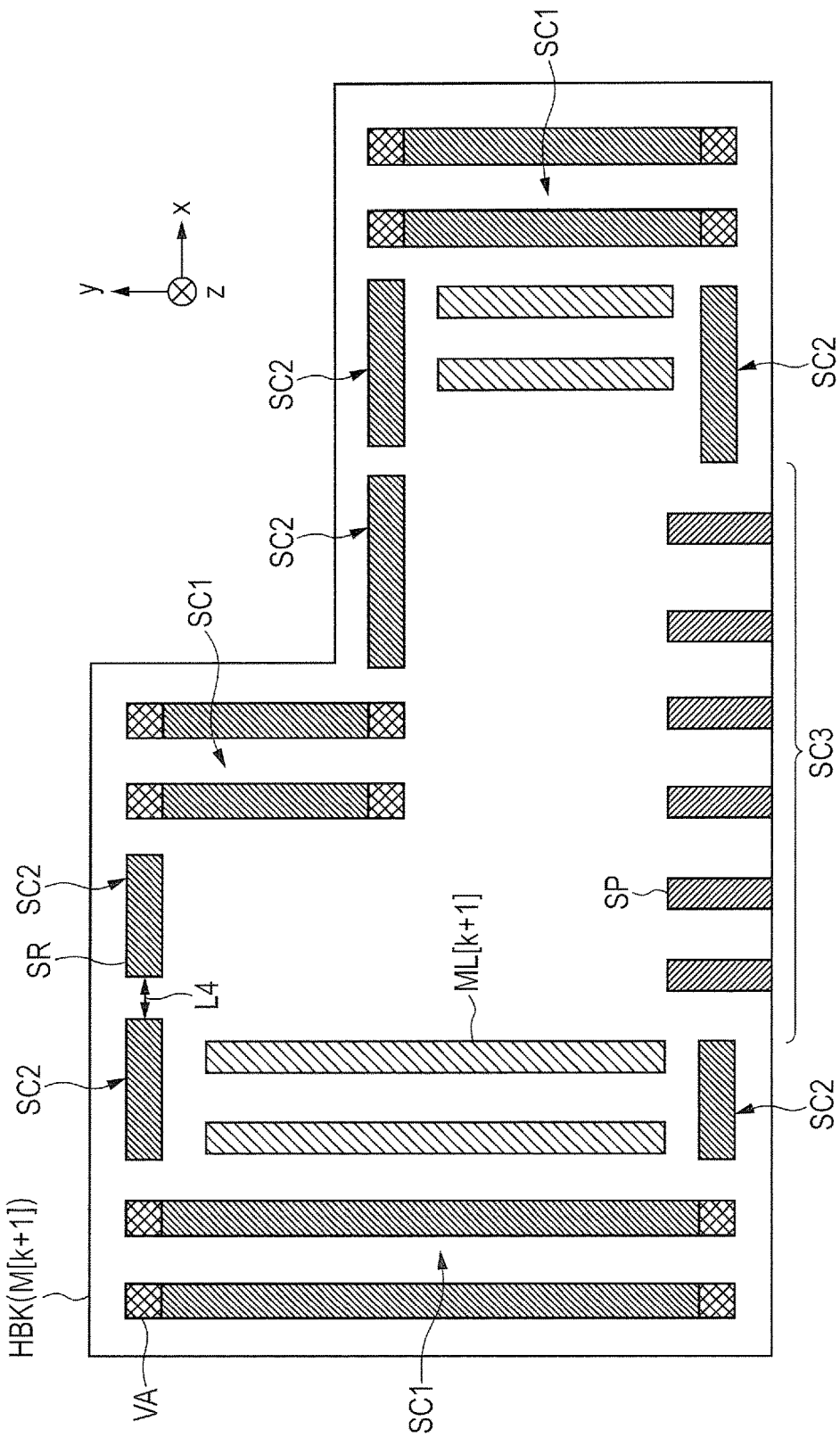
FIG. 14 is a plan view illustrating an example of a layout configuration according to a variation of FIG. 13B.

FIG. 14 is a plan view illustrating an example of a layout configuration according to a variation of FIG. 13B. In the hierarchical block HBK of FIG. 13B, the shield ring wire SR has a shape continuous through the sections SC1 and SC2. On the other hand, in the hierarchical block HBK illustrated in FIG. 14, the shield ring wire SR has a discontinuous shape in the section SC2. In other words, the shield ring wire SR in the section SC2 is formed by a plurality of metal wires appropriately divided in the extending direction.

It is desirable that the shield ring wire SR in the section SC1 has a continuous shape because the wire also plays a role of reducing crosstalk noise, for example, like the case of the metal wiring layer M[k+1] in FIG. 9A. On the other hand, the shield ring wire SR in the section SC2 may not be required to play such a role, because a metal wire that is adjacent and extends in parallel is not placed in principle, for example, like the case of the metal wiring layer M[k+2] in FIG. 9A. Accordingly, the shield ring wire SR in the section SC2 may have a discontinuous shape in some cases.

On the other hand, it is required to avoid the automatic insertion of a dummy metal, and hence a space L4 between adjacent metal wires in the discontinuous metal wire is determined similarly to the case of the above space L3. Further, the discontinuous metal wire does not play a role of reducing crosstalk noise, and hence the voltage thereof may be set to a floating voltage in some cases. However, the accuracy of extracting actual load data is normally increased to a higher level when a fixed voltage (e.g., power supply voltage GND) is applied than when a floating voltage is applied, and hence it is more desirable to apply a power supply voltage (e.g., GND) also to the discontinuous metal wire. In this case, however, there is the fear that the mechanism of applying a power supply voltage (e.g., GND) to the discontinuous metal wire may be complicated. Accordingly, it is more desirable from this viewpoint to adopt a continuous shape, as the case of FIG. 13B.

(Fifth Embodiment)

<<Layout of Metal Wiring Layer (Variation)>>

FIG. 15A is a plan view illustrating an example of a schematic layout configuration of the metal wiring layer in FIG. 2 in a semiconductor device according to Fifth Embodiment of the present invention. FIG. 15B is a plan view illustrating an example of a layout configuration different from that of FIG. 15A. The layout of the metal wiring layer M[k] illustrated in each of FIGS. 15A and 15B corresponds to a variation of the layout illustrated in FIG. 3A. In the layout illustrated in each of FIGS. 15A and 15B, the layouts of the hierarchical blocks HBK3 and HBK4 are different from those in the layout of FIG. 3A.

A hierarchical block can be designed by dividing into an upper hierarchical block and a lower hierarchical block, in the same way as the relationship between a top region (upper) and a hierarchical block (lower). In the example of each of FIGS. 15A and 15B, the hierarchical block HBK3 is an upper hierarchical block, and the hierarchical block HBK4 is a lower hierarchical block. In the example of FIG. 15B, each of the upper hierarchical block HBK3 and the lower hierarchical block HBK4 includes the shield ring wire SR extending along the outer periphery of the self hierarchical block, like the case of First Embodiment.

On the other hand, the example of FIG. 15A has a structure in which the shield ring wire SR in a partial section is shared between the upper hierarchical block HBK3 and the lower hierarchical block HBK4, unlike the case of FIG. 15B. Specifically, for example, by overlapping part of the outer periphery of the lower hierarchical block HBK4 with the outer periphery of the upper hierarchical block HBK3, the shield ring wire SR to be provided in the upper hierarchical block HBK3 can be omitted in the overlapped partial section. In the example of FIG. 15A, three sides that are the outer periphery of the lower hierarchical block HBK4 (two sides extending in the x axis direction and one side extending in the y axis direction) are overlapped with the outer periphery of the upper hierarchical block HBK3, and the shield ring wire SR to be placed in this section of the upper hierarchical block HBK3 is omitted.

<<Designing Method of Semiconductor Device (Variation)>>

Figure 16:
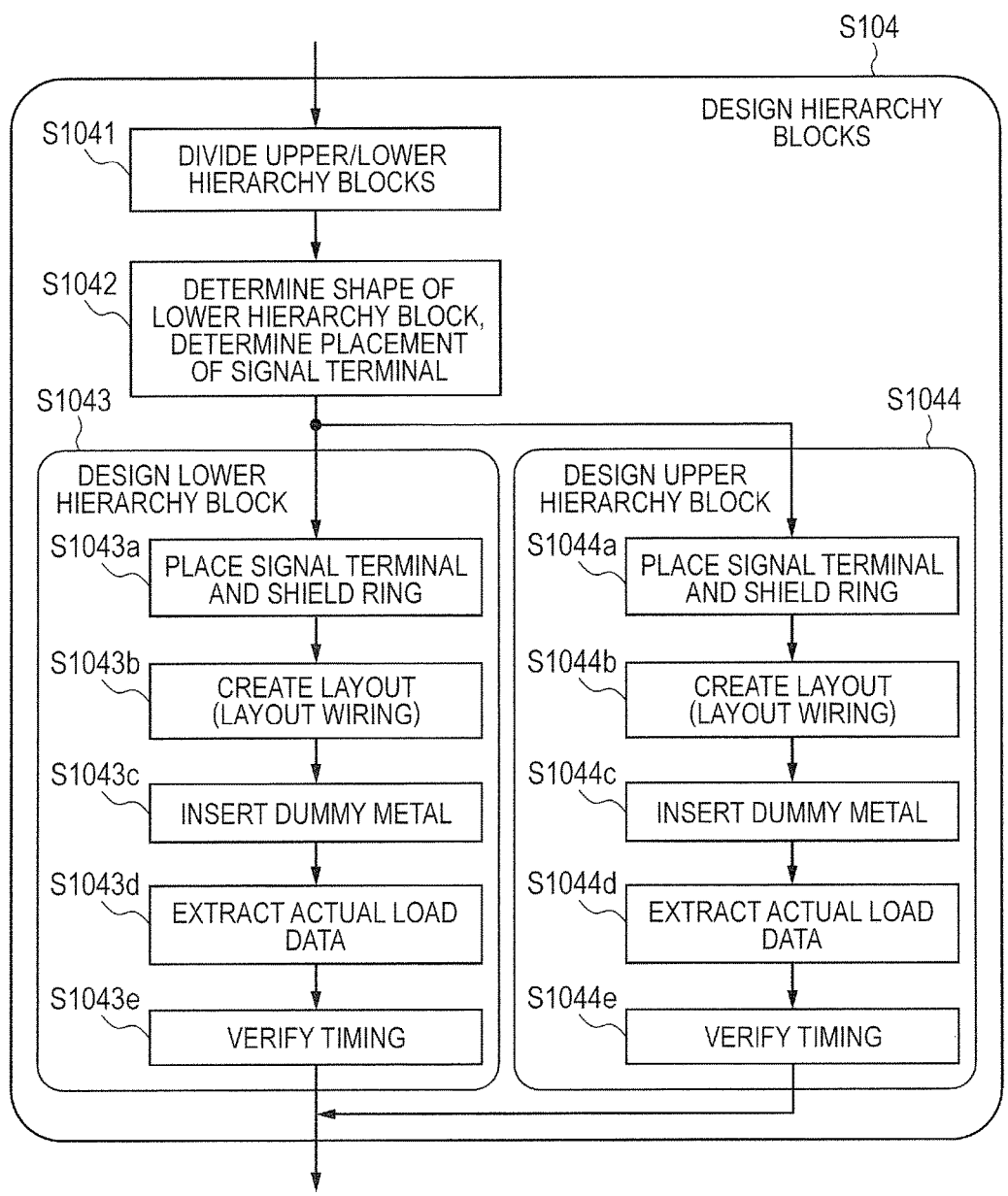
FIG. 16 is a flow chart illustrating an example of a designing method for a semiconductor device of FIGS. 15A and 15B.

FIG. 16 is a flow chart illustrating an example of a designing method for the semiconductor device of FIGS. 15A and 15B. In a designing method according to the present Fifth Embodiment, the same flow as that of FIG. 5 is used, and in designing the hierarchical block in the flow, Step S104 illustrated in FIG. 16 is used instead of Step S104 in FIG. 5. In Step S104 in FIG. 16, a designer first divides a predetermined hierarchical block into an upper hierarchical block and a lower hierarchical block (Step S1041), and determines the shape of the lower hierarchical block and the placement of a signal terminal (Step S1042), like the cases of Steps S102 and S103 in FIG. 5.

Subsequently, a designer designs the respective layouts of the lower hierarchical block and the upper hierarchical block determined in Step S1042 in parallel (Steps S1043 and S1044), like the cases of Steps S104 and S105 (i.e., designing of hierarchical block and top region) in FIG. 5. The flow of designing the lower hierarchical block (Step S1043) is the same as that of Step S104 (i.e., designing of hierarchical block) in FIG. 5.

On the other hand, although the flow of designing the upper hierarchical block (Step S1044) is almost the same as that of the flow of Step S105 (i.e., designing of top region) in FIG. 5, but a signal terminal and the shield ring wire SR are first placed (Step S1044a), unlike the case of the step S105. In placing the shield ring wire SR, a designer can omit the shield ring wire SR in a partial section (i.e., the shield ring wire SR is made shared with the lower hierarchical block), as illustrated in FIG. 15A, depending on the shape of the lower hierarchical block determined in Step S1042.

The invention made by the present inventors has been specifically described above based on embodiments, but the invention should not be limited to the embodiments, and can be variously modified within a range not deviating from the gist of the invention. For example, the above embodiments have been made in order to explain the invention in a clear way, and the invention should not necessarily be limited to embodiments each including all of the described configurations. Additionally, it is possible to replace part of a configuration of an embodiment by a configuration of another embodiment, and it is also possible to add a configuration of an embodiment to a configuration of another embodiment. Additionally, part of a configuration of each embodiment can be eliminated, or added or replaced with another configuration.

For example, the shield ring wire SR is provided in all of the hierarchical blocks in each of the above embodiments; however, it is not always necessary to provide it in all of them. For example, a case can be cited where in designing a certain hierarchical block (wiring region), the layout of the adjacent wiring region is already determined (e.g., such as a case of a hard macro). Or, a case is cited where the adjacent hierarchical block has a power shutdown function. Because the hierarchical block having a power shutdown function includes a power switch provided at the outer periphery, the layout of a boundary portion is already determined. In such a case, designing can be performed while referring to the layout of the boundary portion in the adjacent wiring region as frame data, and hence the shield ring wire SR can also be omitted from the viewpoint of the accuracy of extracting actual load data in Steps S104$d$ and S105$c$ in FIG. 5.

What is claimed is:

1. A semiconductor device that is formed by a single semiconductor chip and comprises a plurality of metal wiring layers,
    wherein each of the metal wiring layers includes a plurality of wiring regions each divided by a side that serves as a boundary, and
    wherein each of the metal wiring layers includes a first wiring region of the wiring regions and the first wiring region has:
    a first shield ring wire that is disposed to extend along an outer periphery of the first wiring region and is formed by a single metal shield wire or by a combination of metal shield wires; and
    a plurality of metal wires that are disposed in a region surrounded by the first shield ring wire and extend in a predetermined preferential direction, and
    the first shield ring wire includes:
    a first section extending in the preferential direction, and
    a second section extending in a non-preferential direction perpendicular to the preferential direction, and
    wherein the preferential direction and the non-preferential direction alternate between adjacent ones of the metal wiring layers.

2. The semiconductor device according to claim 1,
    wherein a wire width of the first shield ring wire in the first section is larger than a wire width thereof in the second section.

3. The semiconductor device according to claim 2,
    wherein the first shield ring wire is formed by the metal shield wires extending side by side in the first section, and
    wherein the first shield ring wire is formed by the single metal shield wire in the second section.

4. The semiconductor device according to claim 2,
    wherein the first shield ring wire is formed by the single metal shield wire both in the first section and in the second section.

5. The semiconductor device according to claim 1,
    wherein each of the metal wiring layers includes a second wiring region of the wiring regions and adjacent to the first wiring region and the second wiring region has:
    a second shield ring wire that is placed to extend along an outer periphery of the second wiring region and is formed by a single metal shield wire or by a combination of metal shield wires, a plurality of metal wires that are disposed in a region surrounded by the second shield ring wire and extend in the preferential direction, and the second shield ring wire includes:

a first section extending in the predetermined preferential direction; and a second section extending in the non-preferential direction perpendicular to the preferential direction.

6. The semiconductor device according to claim 5, wherein a wire width of the second shield ring wire in the first section is larger than a wire width thereof in the second section.

7. The semiconductor device according to claim 1, wherein the first shield ring wire has a shape continuous through the first section and the second section.

8. The semiconductor device according to claim 1, wherein a power supply voltage on a low potential side or a high potential side is applied to first shield ring wire.

9. The semiconductor device according to claim 1, wherein the first wiring region includes a third wiring region inside the first wiring region, and wherein the third wiring region is placed to extend along an outer periphery of the first wiring region, and includes a third shield ring wire formed by a single metal shield wire or by a combination of metal shield wires, and wherein the first shield ring wire in the first wiring region is shared with the third shield ring wire in a partial section.

10. A semiconductor device that is formed by a single semiconductor chip and comprises a plurality of metal wiring layers, wherein each of the metal wiring layers includes a plurality of wiring regions each divided by a side that serves as a boundary, and wherein each of the metal wiring layers includes a first wiring region of the wiring regions and the first wiring region has:

a shield ring wire that is disposed to extend along an outer periphery of the first wiring region and formed by a single metal shield wire or by a combination of metal shield wires;

a plurality of wires that are disposed in a region surrounded by the shield ring wire and extend in a predetermined preferential direction; and a signal terminal to be coupled to a second wiring region of the wiring regions, and the shield ring wire has:

a first section extending in the preferential direction; and a second section extending in a non-preferential direction perpendicular to the preferential direction, and the signal terminal is placed in a third section that is a partial section of the second section extending in the non-preferential direction, the shield ring wire is not disposed in the third section, and wherein the preferential direction and the non-preferential direction alternate between adjacent ones of the metal wiring layers.

11. The semiconductor device according to claim 10, wherein a wire width of the shield ring wire in the first section is larger than a wire width thereof in the second section.

12. The semiconductor device according to claim 10, wherein a power supply voltage on a low potential side or a high potential side is applied to the shield ring wire.

* * * * *